US009119322B2

(12) United States Patent
Mikado et al.

(10) Patent No.: US 9,119,322 B2
(45) Date of Patent: *Aug. 25, 2015

(54) WIRING BOARD AND METHOD FOR MANUFACTURING THE SAME

(71) Applicant: IBIDEN CO., LTD., Ogaki-shi (JP)

(72) Inventors: Yukinobu Mikado, Ogaki (JP); Shunsuke Sakai, Ogaki (JP); Takashi Kariya, Ogaki (JP); Toshiki Furutani, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/510,219

(22) Filed: Oct. 9, 2014

(65) Prior Publication Data

US 2015/0022982 A1   Jan. 22, 2015

Related U.S. Application Data

(63) Continuation of application No. 13/562,683, filed on Jul. 31, 2012, now Pat. No. 8,908,387.

(60) Provisional application No. 61/553,684, filed on Oct. 31, 2011.

(51) Int. Cl.
H05K 1/18       (2006.01)
H05K 3/30       (2006.01)
H01G 2/06       (2006.01)
H05K 1/11       (2006.01)
H05K 3/32       (2006.01)
H05K 1/02       (2006.01)
H05K 3/46       (2006.01)

(52) U.S. Cl.
CPC ............... H05K 1/185 (2013.01); H01G 2/06 (2013.01); H05K 1/115 (2013.01); H05K 3/30 (2013.01); H05K 3/32 (2013.01); H05K 1/0207 (2013.01); H05K 3/4602 (2013.01); H05K 2201/09827 (2013.01); H05K 2201/10015 (2013.01); H05K 2201/1053 (2013.01); H05K 2201/10522 (2013.01); H05K 2201/10636 (2013.01); H05K 2203/1469 (2013.01); Y10T 29/49146 (2015.01)

(58) Field of Classification Search
USPC ................................................. 361/761, 772
See application file for complete search history.

(56) References Cited

U.S. PATENT DOCUMENTS

2013/0182401 A1   7/2013  Furutani et al.
2013/0284506 A1  10/2013  Zanma et al.
2014/0153205 A1   6/2014  Mikado et al.

FOREIGN PATENT DOCUMENTS

JP   2001-345559 A   12/2001
JP   2002-246759 A    8/2002

Primary Examiner — Andargie M Aychillhum
(74) Attorney, Agent, or Firm — Oblon, McClelland, Maier & Neustadt, L.L.P.

(57) ABSTRACT

A wiring board includes a substrate having an opening portion, electronic components positioned in the opening portion of the substrate and including first and second electronic components, and an insulation layer formed over the substrate and the first and second components. The first component has first and second electrodes having side portions on side surfaces of the first component, the second component has first and second electrodes having side portions on side surfaces of the second component, the first electrode of the first component and the first electrode of the second component are set to have substantially the same electric potential, and the first component and the second component are positioned in the opening portion of the substrate such that the side portion of the first electrode of the first component is beside the side portion of the first electrode of the second component.

20 Claims, 25 Drawing Sheets

WIRING BOARD AND METHOD FOR MANUFACTURING THE SAME

CROSS-REFERENCE TO RELATED APPLICATIONS

The present application is a continuation of and claims the benefit of priority to U.S. Ser. No. 13/562,683, filed Jul. 31, 2012, which is based upon and claims the benefit of priority to U.S. Application No. 61/553,684, filed Oct. 31, 2011. The entire contents of these applications are incorporated herein by reference.

BACKGROUND OF THE INVENTION

1. Field of the Invention

The present invention relates to a wiring board and its manufacturing method.

2. Discussion of the Background

Japanese Laid-Open Patent Publication No. 2002-246759 describes a wiring board which has the following: a substrate with an opening section; multiple electronic components accommodated in the opening section; an insulation layer formed on the substrate and the electronic components, a conductive layer formed on the insulation layer; and via conductors electrically connecting the conductive layer and electrodes of the electronic components. Multiple electronic components that have side electrodes are positioned in one opening section formed in the substrate. Then, among the multiple electronic components positioned in the opening section, side electrodes of adjacent electronic components face each other, and those opposing side electrodes have different polarities from each other. The contents of Japanese Laid-Open Patent Publication No. 2002-246759 are incorporated herein by reference in their entirety in this application.

SUMMARY OF THE INVENTION

According to one aspect of the present invention, a wiring board includes a substrate having an opening portion, multiple electronic components positioned in the opening portion of the substrate and including a first electronic component and a second electronic component, and an insulation layer formed over the substrate and the first electronic component and second electronic component of the electronic components. The first electronic component has a first electrode having a side portion formed on a first side surface of the first electronic component and a second electrode having a side portion formed on a second side surface of the first electronic component on the opposite side of the first side surface of the first electronic component, the second electronic component has a first electrode having a side portion formed on a first side surface of the second electronic component and a second electrode having a side portion formed on a second side surface of the second electronic component on the opposite side of the first side surface of the second electronic component, the first electrode of the first electronic component and the first electrode of the second electronic component are set to have substantially the same electric potential, and the first electronic component and the second electronic component are positioned in the opening portion of the substrate such that the side portion of the first electrode of the first electronic component is beside the side portion of the first electrode of the second electronic component.

According to another aspect of the present invention, a method for manufacturing a wiring board includes preparing a substrate having an opening portion, disposing in the opening portion of the substrate multiple electronic components including a first electronic component and a second electronic component, and forming an insulation layer over the substrate and the first electronic component and second electronic component of the electronic components. The first electronic component has a first electrode having a side portion formed on a first side surface of the first electronic component and a second electrode having a side portion formed on a second side surface of the first electronic component on the opposite side of the first side surface of the first electronic component, the second electronic component has a first electrode having a side portion formed on a first side surface of the second electronic component and a second electrode having a side portion formed on a second side surface of the second electronic component on the opposite side of the first side surface of the second electronic component, the disposing of the electronic components includes positioning the first electronic component and the second electronic component in the opening portion of the substrate such that the side portion of the first electrode of the first electronic component is beside the side portion of the first electrode of the second electronic component, and setting the first electrode of the first electronic component and the first electrode of the second electronic component to have substantially the same electric potential.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
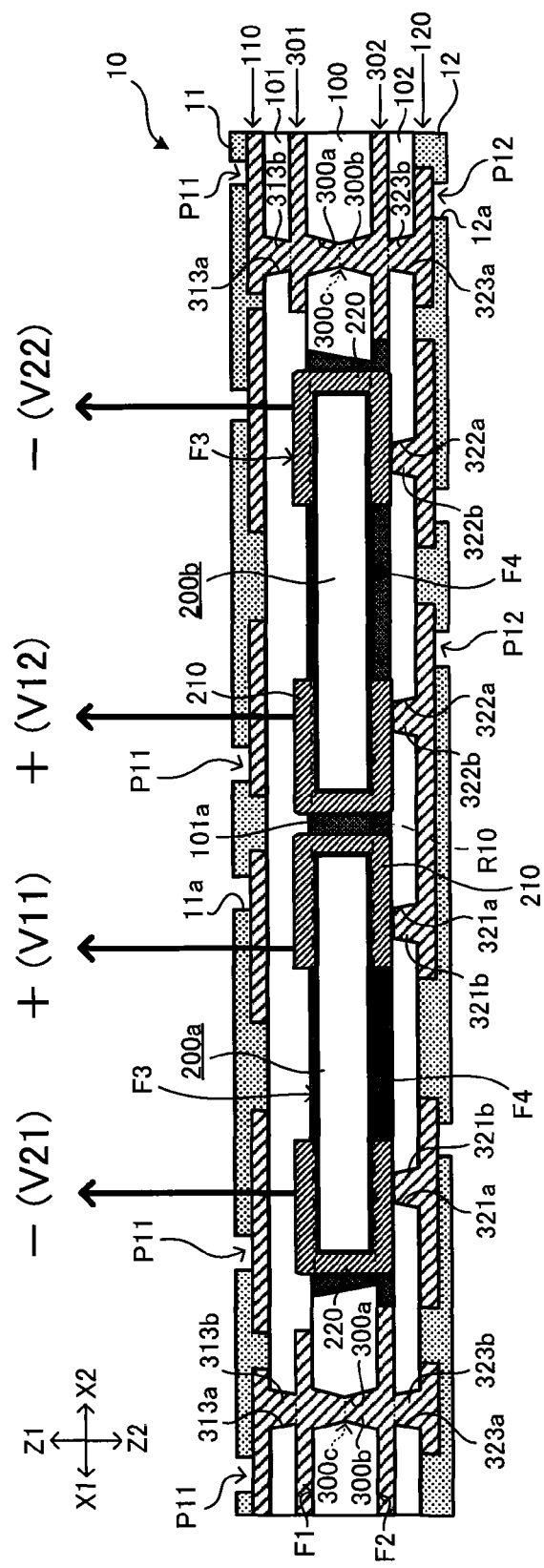
FIG. 1 is a cross-sectional view of a wiring board according to an embodiment of the present invention.

The embodiments will now be described with reference to the accompanying drawings, wherein like reference numerals designate corresponding or identical elements throughout the various drawings.

In the drawings, arrows (Z1, Z2) each indicate a lamination direction of a wiring board (or a thickness direction of the wiring board) corresponding to a direction of a normal line along main surfaces (upper and lower surfaces) of the wiring board. On the other hand, arrows (X1, X2) and (Y1, Y2) each indicate a direction perpendicular to a lamination direction (or a direction toward a side surface of each layer). The main surfaces of the wiring board are on the X-Y plane. Side surfaces of the wiring board are on the X-Z plane or the Y-Z plane.

Two main surfaces in opposing directions along a normal line are referred to as a first surface or a third surface (Z1-side surface) and as a second surface or a fourth surface (Z2-side surface). In a lamination direction, a side closer to the core is referred to as a lower layer (or an inner-layer side), and a side farther from the core is referred to as an upper layer (or an outer-layer side). "Directly on" means a direction Z (Z1 side or Z2 side). A planar shape means a shape on the X-Y plane unless otherwise specified.

A conductive layer is a layer formed with one or multiple conductive patterns. A conductive layer may include a conductive pattern that forms an electrical circuit such as wiring (including ground), a pad, a land or the like. A conductive pattern may also include a planar conductive pattern or the like that does not form an electrical circuit.

Opening portions include notches, slits and so forth in addition to holes and grooves. Holes are not limited to penetrating holes, but include non-penetrating holes. Holes include via holes and through holes. In the following, the conductor formed in a via hole (on its wall surface or bottom surface) is referred to as a via conductor, and the conductor formed in a through hole (on its wall surface) is referred to as a through-hole conductor.

Plating includes wet plating such as electrolytic plating as well as dry plating such as PVD (physical vapor deposition) and CVD (chemical vapor deposition).

A side electrode means an electrode that covers at least part of a side surface.

"An electronic component positioned in an opening section" includes situations in which the entire electronic component is completely accommodated in the opening section as well as situations in which only part of the electronic component is positioned in the opening section.

"Preparing" includes situations in which material and components are purchased and manufactured accordingly as well as situations in which finished products are purchased and used accordingly.

In the following, an embodiment of the present invention is described in detail by referring to the drawings.

As shown in FIG. 1, wiring board 10 according to the present embodiment has the following: substrate 100 (insulative substrate), insulation layers (101, 102) (interlayer insulation layers), conductive layers (110, 120), electronic components (200a, 200b) (first and second electronic components), and solder-resist layers (11, 12). Electronic components (200a, 200b) are each built into wiring board 10. Wiring board 10 of the present embodiment is a rigid wiring board. However, wiring board 10 may be a flexible wiring board. In the following, one of the upper and lower surfaces (two main surfaces) of substrate 100 is referred to as first surface (F1) and the other as second surface (F2). In addition, regarding the upper and lower surfaces (two main surfaces) of electronic components (200a, 200b), the surface facing the same direction as first surface (F1) is referred to as third surface (F3) and the other as fourth surface (F4).

Substrate 100 is insulative and becomes the core substrate of wiring board 10. Through hole (300a) is formed in substrate 100 (core substrate), and through-hole conductor (300b) is formed by filling a conductor (such as copper plating) in through hole (300a). Through-hole conductor (300b) is shaped like an hourglass, for example. Namely, through-hole conductor (300b) has narrowed portion (300c), and the width of through-hole conductor (300b) gradually becomes smaller as it comes closer to narrowed portion (300c) from first surface (F1) and also gradually becomes smaller as it comes closer to narrowed portion (300c) from second surface (F2). However, that is not the only option, and the shape of through-hole conductor (300b) is not limited specifically. For example, it may be shaped substantially columnar.

Conductive layer 301 is formed on first surface (F1) of substrate 100, and conductive layer 302 is formed on second surface (F2) of substrate 100. Conductive layers (301, 302) each include a land of through-hole conductor (300b). Conductive layer 301 and conductive layer 302 are electrically connected to each other by through-hole conductor (300b).

Substrate 100 has an opening section that penetrates through substrate 100. Specifically, cavity (R10) is formed as an opening section in substrate 100, and electronic components (200a, 200b) are accommodated in cavity (R10). In the present embodiment, cavity (R10) is a hole that penetrates through substrate 100. Electronic components (200a, 200b) are each positioned in cavity (R10) to be arrayed in a side direction (direction X or direction Y) of substrate 100. Namely, two electronic components (electronic components (200a, 200b)) are positioned in one opening section (cavity (R10)) in the present embodiment.

In the present embodiment, electronic components (200a, 200b) are formed with electronic components of the same type. In particular, electronic components (200a, 200b) are chip capacitors each having a structure shown in FIGS. 2A~3B. If an electronic component (chip capacitor) that forms electronic component (200a) (first electronic component) and an electronic component (chip capacitor) that forms electronic component (200b) (second electronic component) are switched with each other, they will function. In the present embodiment, since all the electronic components to be positioned in cavity (R10) (electronic components (200a, 200b)) are formed with electronic components of the same type, electronic components of one type are prepared. In addition, the procedure for positioning electronic components in cavity (R10) becomes simplified, and manufacturing is easier.

Figure 2A:
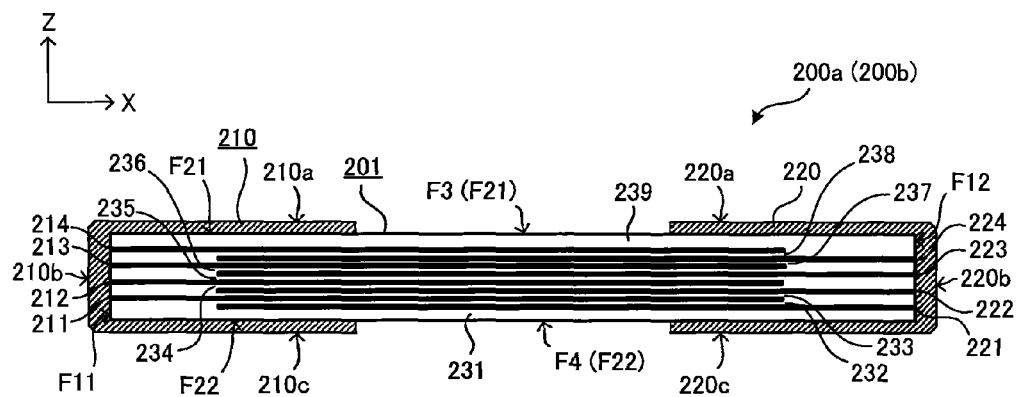
FIG. 2A is a view showing a first cross-sectional shape of a chip capacitor built into a wiring board according to the embodiment of the present invention.
Figure 2B:
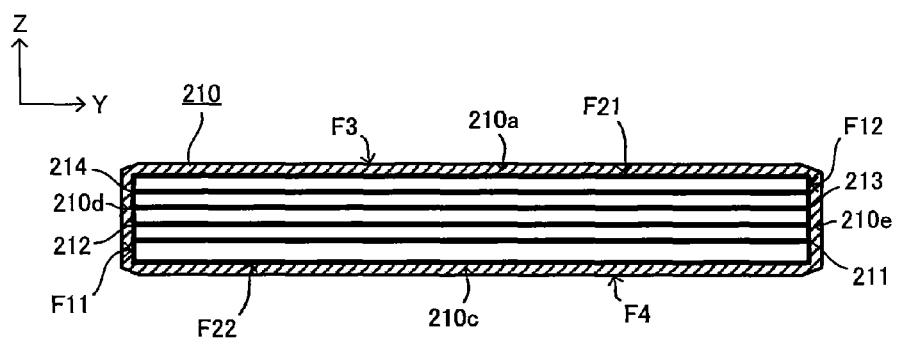
FIG. 2B is a view showing a second cross-sectional shape of a chip capacitor built into a wiring board according to the embodiment of the present invention.
Figure 3A:
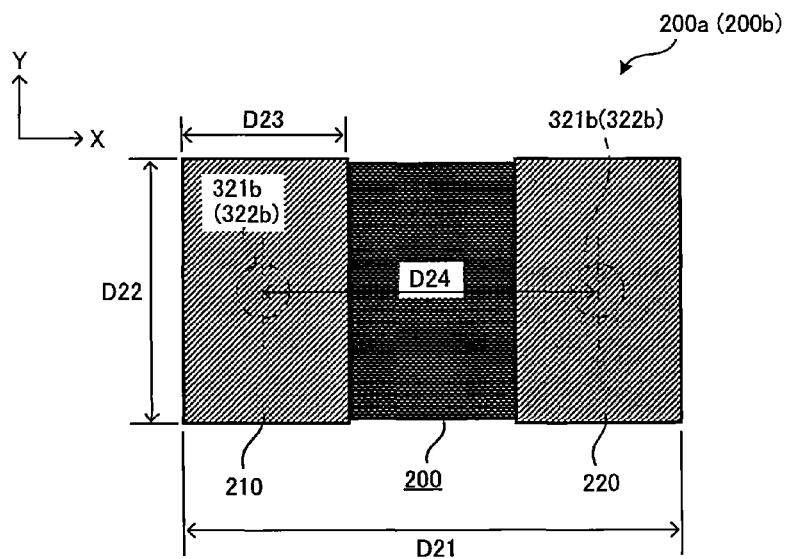
FIG. 3A is a plan view of a chip capacitor built into a wiring board according to the embodiment of the present invention.
Figure 3B:
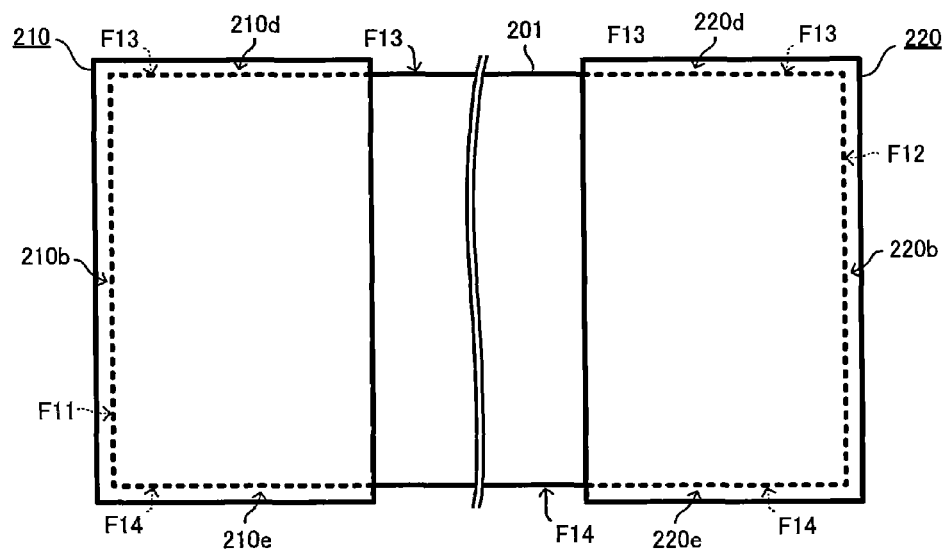
FIG. 3B is a plan view showing electrodes formed on their respective sides of a chip capacitor built into a wiring board according to the embodiment of the present invention.

In the following, the structure of electronic components (200a, 200b) (chip capacitors) to be built into wiring board 10 according to the present embodiment is described with reference to FIGS. 2A~3B. FIG. 2A is a view showing a first cross-sectional shape (X-Z cross section) of electronic components (200a, 200b). FIG. 2B shows a second cross-sectional shape (Y-Z cross section) of electronic components (200*a*, 200*b*). FIG. 3A is a plan view of electronic components (200*a*, 200*b*). FIG. 3B is a view showing electrodes each formed on a side surface of electronic components (200*a*, 200*b*).

As shown in FIGS. 2A-3B, electronic components (200*a*, 200*b*) are each a chip-type MLCC (multilayer ceramic capacitor), and have capacitor body 201 and electrodes (210, 220). As shown in FIG. 2A, capacitor body 201 is formed by alternately laminating multiple dielectric layers (231~239) and multiple conductive layers (211~214, 221~224). Dielectric layers (231~239) are each made of ceramic, for example. Electrodes (210, 220) are formed respectively on both ends of capacitor body 201.

As shown in FIG. 2A, electrodes (210, 220) each have a U-shaped cross-sectional shape (X-Z cross section). Electronic components (200*a*, 200*b*) each have first side portion (210*b*) (first side electrode) of electrode 210 on first side surface (F11) and second side portion (220*b*) (second side electrode) of electrode 220 on second side surface (F12) opposite first side surface (F11). Capacitor body 201 is covered by electrodes (210, 220) from lower surface (F22) (the surface on the fourth-surface (F4) side), to first side surface (F11) or second side surface (F12), to upper surface (F21) (the surface on the third-surface (F3) side). Here, electrode 210 is formed with upper portion (210*a*) covering part of the upper surface of capacitor body 201, first side portion (210*b*) (first side electrode) covering the entire side surface (F11) of capacitor body 201, and lower portion (210*c*) covering part of the lower surface of capacitor body 201. Also, electrode 220 is formed with upper portion (220*a*) covering part of the upper surface of capacitor body 201, second side portion (220*b*) (second side electrode) covering the entire second side surface (F12) of capacitor body 201, and lower portion (220*c*) covering part of the lower surface of capacitor body 201. In the present embodiment, upper portion (210*a*), first side portion (210*b*) and lower portion (210*c*) are formed to be one entity as electrode 210, and upper portion (220*a*), second side portion (220*b*) and lower portion (220*c*) are formed to be one entity as electrode 220.

As shown in FIG. 3B, regarding third side surface (F13) and fourth side surface (F14) on both sides of first side surface (F11), third side portion (210*d*) (third side electrode) of electrode 210 is positioned on third side surface (F13), and fourth side portion (210*e*) (fourth side electrode) of electrode 210 is positioned on fourth side surface (F14). Also, regarding third side surface (F13) and fourth side surface (F14) on both sides of second side surface (F12), fifth side portion (220*d*) of electrode 220 is positioned on third side surface (F13), and sixth side portion (220*e*) of electrode 220 is positioned on fourth side surface (F14). Third side portion (210*d*) and fourth side portion (210*e*) are each integrated with first side portion (210*b*) (first side electrode), and fifth side portion (220*d*) and sixth side portion (220*e*) are each integrated with second side portion (220*b*) (second side electrode).

In the present embodiment, electrode 210 is set as positive (+) and electrode 220 as negative (−). In the present embodiment, since electronic components (200*a*, 200*b*) each have a structure where an end along a direction X (the side of electrode 210, for example) and the other end (the side of electrode 220, for example) are set symmetrically as shown in FIGS. 2A~3B, electronic components (200*a*, 200*b*) will function even when the polarities of electrode 210 (first side electrode) and electrode 220 (second side electrode) are reversed. Therefore, when electronic components are positioned in cavity (R10), it is not required to determine which of the electronic components is set as electronic component (200*a*) (or set as electronic component (200*b*)) in wiring board 10 of the present embodiment.

As shown in FIG. 3A, since the central portion of capacitor body 201 positioned between electrode 210 and electrode 220 is not covered by electrodes (210, 220) and dielectric layers (231, 239) (ceramic) are exposed, its strength is relatively low. However, when electronic components (200*a*, 200*b*) are mounted (built) in wiring board 10, the central portion of capacitor body 201 is covered by insulator (101*a*) or the like (resin). Thus, capacitor body 201 is thought to be protected by insulator (101*a*) or the like.

Figure 4:
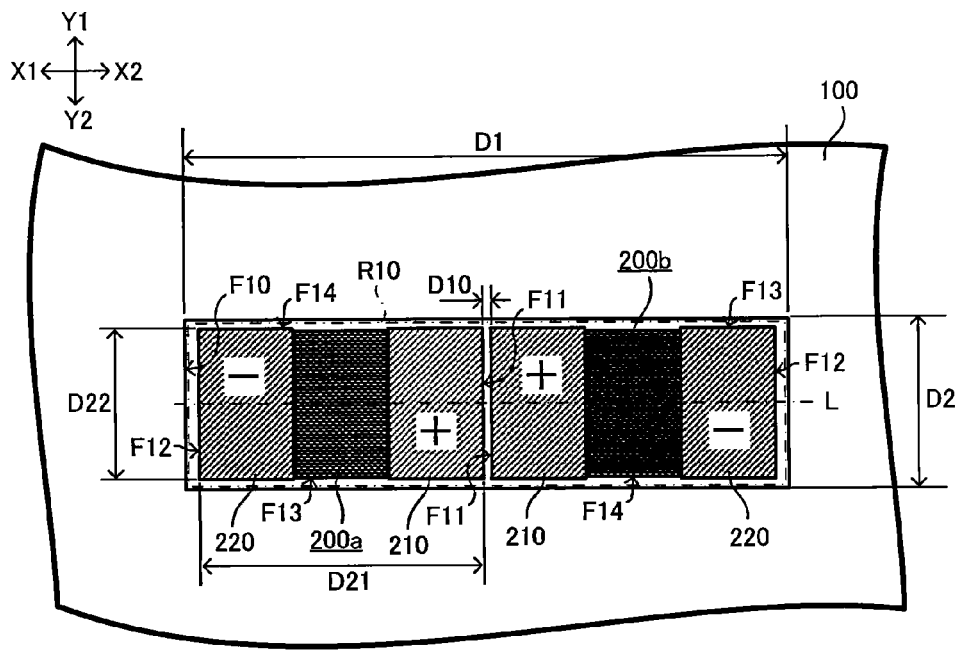
FIG. 4 is a plan view showing a state in which electronic components are accommodated in a cavity of a substrate (core substrate)

FIG. 4 shows a state where electronic components (200*a*, 200*b*) are accommodated in cavity (R10) of substrate 100 (core substrate). Electrode 210 (especially, first side portion (210*b*)) and electrode 220 (especially, second side portion (220*b*)) of electronic component (200*a*) (first electronic component) are arrayed on substantially a straight line (on straight line (L) in FIG. 4, for example) with electrode 210 (especially, first side portion (210*b*)) and electrode 220 (especially, second side portion (220*b*)) of electronic component (200*b*) (second electronic component). In addition, electrode 210 (especially, first side portion (210*b*)) of electronic component (200*a*) and electronic component 210 (especially, first side portion (210*b*)) of electronic component (200*b*) face each other while having substantially the same electric potential.

As shown in FIG. 4, the opening shapes at both ends of cavity (R10) (first-surface (F1) side and second-surface (F2) side) are each rectangular. In cavity (R10), electronic components (200*a*, 200*b*) are positioned along a direction (direction X, for example). Electronic components (200*a*, 200*b*) each have a pair of side electrodes (electrodes (210, 220)) arrayed along the direction in which electronic components (200*a*, 200*b*) are positioned (direction X, for example). In the present embodiment, a longitudinal direction of electronic components (200*a*, 200*b*) and the direction in which electrodes (210, 220) are arrayed are the same and both in direction X. However, that is not the only option, and electrodes (210, 220) may be arrayed along a lateral direction of electronic components (200*a*, 200*b*) (see later-described FIG. 30).

Figure 5:
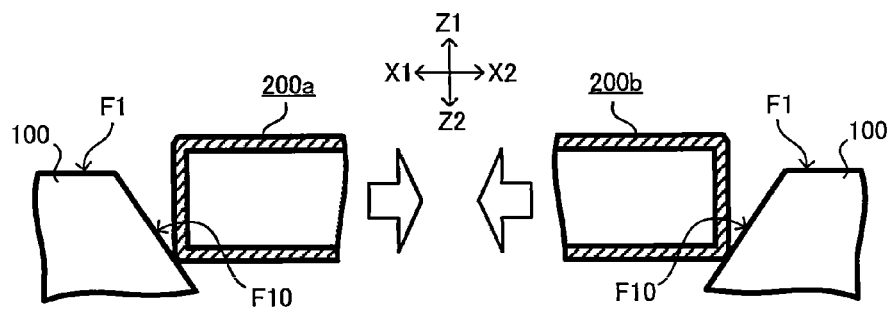
FIG. 5 is a view showing how the movement of an electronic component is regulated by wall surfaces of the cavity at the periphery of the cavity.

In the present embodiment, electronic components (200*a*, 200*b*) are surrounded by wall surfaces (F10) of cavity (R10) (cut surfaces of substrate 100). Wall surfaces (F10) are tapered. Specifically, wall surfaces (F10) are tapered in such a way that the width of cavity (R10) becomes gradually smaller from first surface (F1) toward second surface (F2) as shown in FIGS. 1 and 5. Accordingly, when electronic components (200*a*, 200*b*) make a move toward exiting cavity (R10), such movement is blocked by wall surfaces (F10) as shown in FIG. 5, while the sloped wall surfaces (F10) exert force on electronic components (200*a*, 200*b*) toward the inside of cavity (R10). As a result, positional shifting of electronic components (200*a*, 200*b*) is less likely to occur.

Also, the area of the opening at one end (Z1 side) of cavity (R10) is set greater than the area of the opening at the other end (Z2 side). Thus, it is easier to place electronic components (200*a*, 200*b*) into cavity (R10) from the first-surface (F1) side (Z1 side) of substrate 100.

Figure 6A:
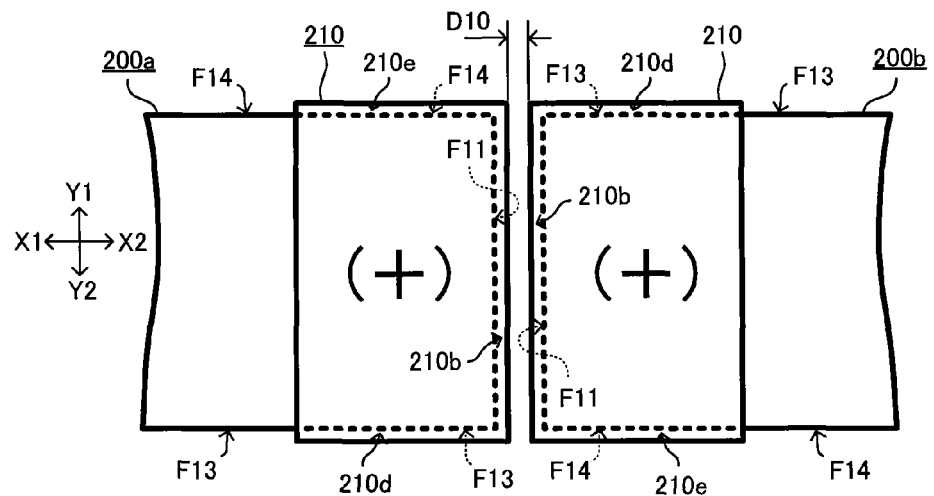
FIG. 6A is a magnified view showing the space between adjacent electronic components.
Figure 6B:
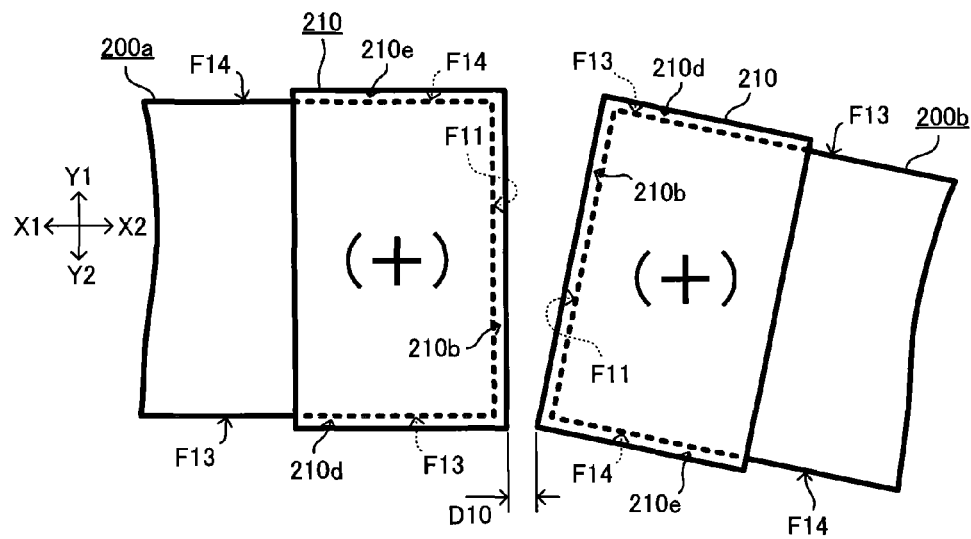
FIG. 6B is a view showing an example in which one of the adjacent electronic components is positioned tilting toward the other.

In the present embodiment, electrodes (210, 220) (each a side electrode) of electronic components (200*a*, 200*b*) adjacent in cavity (R10) (opening section) face each other. In cavity (R10), adjacent electronic components (200*a*, 200*b*) may be positioned parallel to each other as shown in FIG. 6A, or may be positioned in such a way that one of the electronic components is tilted toward the other as shown in FIG. 6B.

In the present embodiment, opposing electrodes (210, 220) of electronic components (200*a*, 200*b*) adjacent in cavity (R10) are set to have substantially the same electric potential as each other. In FIG. 1, electric potential (V11) at electrode 210 of electronic component (200a) and electric potential (V12) at electrode 210 of electronic component (200b) have the same polarity (positive polarity) and their absolute values are substantially equal (V11=V12). As shown in FIGS. 1 and 4, electrode 210 of electronic component (200a) and its opposing electrode 210 of electronic component (200b) are each set positive in the present embodiment.

Figure 7:
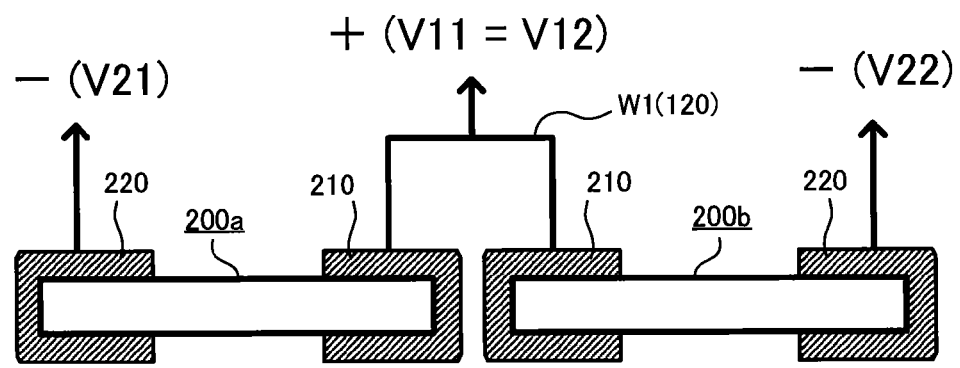
FIG. 7 is a view illustrating an example in which opposing electrodes of adjacent electronic components are electrically connected to each other through wiring in a wiring board according to the embodiment of the present invention.

As shown in FIG. 7, wiring board 10 of the present embodiment has wiring (W1) which electrically connects opposing side electrodes (electrode 210 of electronic component (200a) and electrode 210 of electronic component (200b)) with each other. In the present embodiment, wiring (W1) is included in conductive layer 120 (see FIG. 1). Wiring (W1) is electrically connected to the power source through a die, for example. Also, electrode 220 of electronic component (200a) and electrode 220 of electronic component (200b) are electrically connected to the same or separate ground, for example. Accordingly, in FIG. 1, electric potential (V21) at electrode 220 of electronic component (200a) and electric potential (V22) at electrode 220 of electronic component (200b) are each the same as the electric potential of ground line. The electric potential difference between power source and ground is 6.3 V, for example.

By electrically connecting opposing side electrodes (electrode 210 of electronic component (200a) and electrode 210 of electronic component (200b)) in advance, electric potential tends not to vary when those side electrodes make contact.

Figure 8:
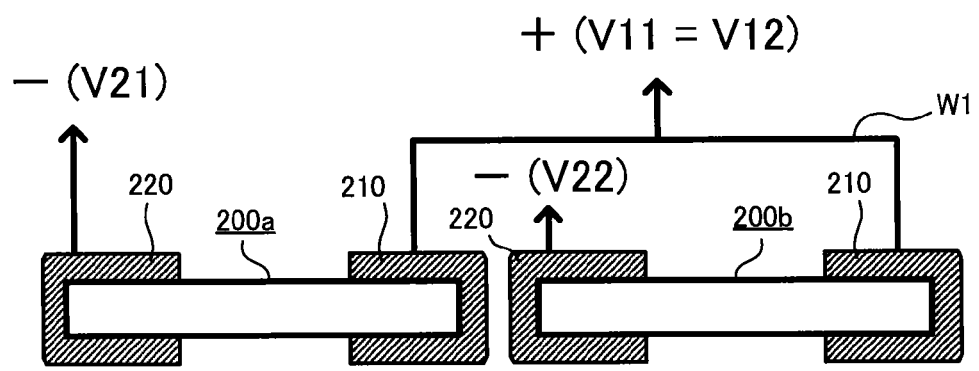
FIG. 8 is, by contrast with the wiring board shown in FIG. 7, a view showing a comparative example in which electrodes that do not face each other in adjacent electronic components are electrically connected through wiring.

In the present embodiment, since opposing electrodes (210, 210) of electronic components (200a, 200b) adjacent in cavity (R10) are electrically connected to each other through wiring (W1) as shown in FIG. 7, it is easier to reduce the length of wiring (W1), compared with a wiring board where electrodes (210, 210) that do not face each other are electrically connected through wiring (W1) as shown in FIG. 8.

In the present embodiment, insulator (101a) is filled between electronic components (200a, 200b) and substrate 100 in cavity (R10) and between electronic component (200a) and electronic component (200b) as shown in FIG. 1. In the present embodiment, insulator (101a) is made from the insulative material (resin, in particular) of upper insulation layer 101 (resin insulation layer, in particular). Insulator (101a) has a greater thermal expansion coefficient than any of substrate 100 and electronic components (200a, 200b).

Insulation layer 101 is formed on first surface (F1) of substrate 100 and third surfaces (F3) of electronic components (200a, 200b). Insulation layer 102 is formed on second surface (F2) of substrate 100 and fourth surfaces (F4) of electronic components (200a, 200b). Insulation layer 101 covers one opening (the first-surface (F1) side) of cavity (R10) (hole), and insulation layer 102 covers the other opening (second-surface (F2) side) of cavity (R10) (hole). Conductive layer 110 is formed on insulation layer 101, and conductive layer 120 is formed on insulation layer 102. In the present embodiment, conductive layers (110, 120) are the outermost layers. However, that is not the only option, and more interlayer insulation layers and conductive layers may further be laminated.

Hole (313a) (via hole) is formed in insulation layer 101, and holes (321a, 322a, 323a) (via holes) are formed in insulation layer 102. Holes (313a, 321a, 322a, 323a) are each filled by conductor (such as copper plating) so that the conductors in the holes respectively become via conductors (313b, 321b, 322b, 323b) (filled conductors).

Via conductors (321b, 322b) are electrically connected to electrodes (210, 220) of electronic components (200a, 200b) respectively from the second-surface (F2) side of substrate 100. As described, electronic components (200a, 200b) of the present embodiment are connected to via conductors from either the upper or lower surface. Hereinafter, such a structure is referred to as a single-sided via structure.

Because of the above single-sided via structure, electrodes (210, 220) of electronic component (200a) or (200b) and conductive layer 120 on insulation layer 102 are electrically connected to each other by via conductor (321b) or (322b). In such a structure, it is advantageous for miniaturization since electrical connections are formed in an inner layer.

Holes (313a, 323a) each reach through-hole conductor (300b), and via conductors (313b, 323b) are electrically connected to through-hole conductor (300b) from the first-surface (F1) side or the second-surface (F2) side of substrate 100. Via conductors (313b, 323b) are each positioned directly on through-hole conductor (300b). Then, conductive layer 301 on first surface (F1) of substrate 100 is electrically connected to conductive layer 110 on insulation layer 101 by via conductor (313b), and conductive layer 302 on second surface (F2) of substrate 100 is electrically connected to conductive layer 120 on insulation layer 102 by via conductor (323b).

In the present embodiment, via conductors (313b, 323b) and through-hole conductor (300b) are each a filled conductor, and are stacked in direction Z. Such a stacked structure is advantageous for miniaturization.

Conductive layer 110 becomes the outermost conductive layer on the first-surface (F1) side, and conductive layer 120 becomes the outermost conductive layer on the second-surface (F2) side. Solder-resist layers (11, 12) are formed respectively on conductive layers (110, 120). However, opening portions (11a, 12a) are formed respectively in solder-resist layers (11, 12). Thus, a predetermined portion of conductive layer 110 (a spot positioned in opening portion (11a)) is exposed without being covered by solder-resist layer 11 to become pad (P11). Also, a predetermined portion of conductive layer 120 (a spot positioned in opening portion (12a)) becomes pad (P12). Pad (P11) becomes an external connection terminal for electrical connection with another wiring board, for example, and pad (P12) becomes an external connection terminal for mounting an electronic component, for example. However, pads (P11, P12) are not limited to being used as above, and they may be used in any other way.

Wiring board 10 of the present embodiment has pads (P11, P12) (external connection terminals) directly on electronic component (200a) or (200b). Also, wiring board 10 has pads (P11, P12) (external connection terminals) directly on substrate 100. Pads (P11, P12) have anticorrosion layers made of Ni/Au film, for example, on their respective surfaces. Anticorrosion layers may be formed by electrolytic plating, sputtering or the like. Alternatively, anticorrosion layers may be made of organic protective film by performing an OSP treatment. Here, anticorrosion layers are not always required, and may be omitted unless necessary.

Here, regarding dimensions shown in FIGS. 3A, 4, 6A and 6B, examples of their respective preferred values are listed.

Width (D1) of cavity (R10) in a longitudinal direction (direction X) is approximately 2160 μm, and width (D2) of cavity (R10) in a lateral direction (direction Y) is approximately 580 μm.

Width (D21) of electronic component (200a) in a longitudinal direction (direction X) is approximately 1000 μm, and width (D22) of electronic component (200a) in a lateral direction (direction Y) is approximately 500 μm. Width (D23) of upper portion (210a) or lower portion (210c) of electrode 210 is approximately 230 μm. Dimensions of electrode 220 are the same as those of electrode 210, for example. Dimensions of electronic component (200b) are the same as those of electronic component (200a), for example.

Regarding the clearance between electronic component (200a) or (200b) and cavity (R10), it is approximately 160 μm (=approximately 2160 μm—approximately 1000 μm×2) in a longitudinal direction (direction X); and it is approximately 80 μm (=approximately 580 μm—approximately 500 μm) in a lateral direction (direction Y).

Regarding distance (D10) between adjacent electronic components (200a, 200b), namely the minimum distance between opposing first side portions (210b) (first side electrodes), it is preferred to be 150 μm or less. If distance (D10) between electronic component (200a) and electronic component (200b) is small, it is easier to make cavity (R10) smaller. As a result, positional shifting of electronic components built into wiring board 10 is less likely to occur, or the wiring region on substrate 100 is easier to increase. In the present embodiment, since opposing electrodes (210, 210) of electronic components (200a, 200b) adjacent in cavity (R10) are set to have substantially the same electric potential, electrical characteristics are less likely to be degraded even when such electrodes (210, 210) make contact with each other. Accordingly, it is easier to reduce distance (D10) (minimum distance).

Pitch (D24) set for via conductor (321b) or (322b) is approximately 770 μm, for example.

In the present embodiment, substrate 100, insulation layers (101, 102), solder resists (11, 12) and electronic components (200a, 200b) are each shaped rectangular, for example. However, that is not the only option, and substrate 100 and others may be shaped freely.

The thickness of substrate 100 is approximately 100 μM, for example. The thicknesses of electronic components (200a, 200b) (thickness including electrodes) are each approximately 150 μm, for example. The thickness of wiring board 10 (thickness from solder resist 11 to solder resist 12) is approximately 290 μm, for example.

Substrate 100 is made by impregnating glass cloth (core material) with epoxy resin (hereinafter referred to as glass epoxy), for example. Core material has a smaller thermal expansion coefficient than the primary material (epoxy resin in the present embodiment). As for core material, it is preferred to use inorganic material such as glass fiber (glass cloth or glass non-woven fabric, for example), aramid fiber (aramid non-woven fabric, for example), silica filler or the like. However, basically, the material for substrate 100 may be selected freely. For example, epoxy resin may be substituted with polyester resin, bismaleimide triazine resin (BT resin), imide resin (polyimide), phenol resin, allyl polyphenylene ether resin (A-PPE resin) or the like. Substrate 100 may be formed with multiple layers of different materials.

In the present embodiment, insulation layers (101, 102) are each made by impregnating core material with resin. Specifically, insulation layers (101, 102) are made of glass epoxy, for example. Since insulation layers (101, 102) are made of resin containing core material, recesses are less likely to be formed in insulation layers (101, 102). Accordingly, conductive patterns formed on insulation layers (101, 102) are suppressed from breaking. In addition, electronic components (200a, 200b) are suppressed from moving in direction Z, and positional shifting of electronic components (200a, 200b) in direction Z is less likely to occur.

However, the above setting is not the only option, and insulation layers (101, 102) may be made of resin without core material, for example. Basically, the material for insulation layers (101, 102) may be selected freely. For example, epoxy resin may be substituted with polyester resin, bismaleimide triazine resin (BT resin), imide resin (polyimide), phenol resin, allyl polyphenylene ether resin (A-PPE resin) or the like. Each insulation layer may be formed with multiple layers of different materials.

Via conductors (313b, 321b, 322b, 323b) are each made of copper plating, for example. The via conductors are shaped, for example, to be a tapered column (truncated cone) that tapers with a diameter increasing from substrate 100 (core substrate) or electronic components (200a, 200b) toward their respective upper layers. However, that is not the only option, and via conductors may be shaped freely.

Conductive layers (110, 120) are each made of copper foil (lower layer) and copper plating (upper layer), for example. Conductive layers (110, 120) have wiring for forming electrical circuits, lands, plain patterns to enhance the strength of wiring board 10 and the like, for example.

Materials for each conductive layer and each via conductor are not limited specifically as long as they are conductive. They may be metallic or non-metallic. Each conductive layer and each via conductor may be formed with multiple layers of different materials.

In wiring board 10 of the present embodiment, since opposing electrodes (210, 210) of electronic components (200a, 200b) adjacent in cavity (R10) are set to have substantially the same electric potential, electrical characteristics are less likely to be degraded even when such electrodes (210, 210) make contact with each other. Accordingly, it is easier to reduce distance (D10) between electronic component (200a) and electronic component (200b) (see FIGS. 6A, 6B). When distance (D10) is reduced, it is easier to make cavity (R10) smaller. As a result, positional shifting of electronic components built into wiring board 10 is less likely to occur, or it is easier to increase the wiring region on substrate 100.

Also, since positional shifting of electronic components (200a, 200b) positioned in cavity (R10) is suppressed, the reliability of electrical connections (for instance, via connections) of electronic components (200a, 200b) built into wiring board 10 is enhanced.

In the present embodiment, some of pads (P11, P12) (external connection terminals) are positioned directly on electronic component (200a) or (200b). Since positional shifting of electronic components built into wiring board 10 is less likely to occur in the present embodiment, it is easier to electrically connect at high reliability the electrodes of such electronic components and external connection terminals positioned directly on them by via conductors (such as via conductors (321b, 322b)).

Multiple electronic components are built into wiring board 10 of the present embodiment. Since multiple electronic components (electronic components (200a, 200b)) are accommodated in one cavity (R10) (opening section) in wiring board 10, space required for accommodating multiple electronic components is smaller, compared with situations where one electronic component is accommodated in one cavity (R10). Thus, it is advantageous for miniaturization. Accordingly, it is easier to obtain a CSP (chip size package) having highly integrated wiring. In addition, it is easier to obtain a substrate with built-in electronic components having a large-capacitance capacitor function, and it is also easier to obtain a CSP which is less affected by voltage dropoff during high-frequency operations.

Figure 9:
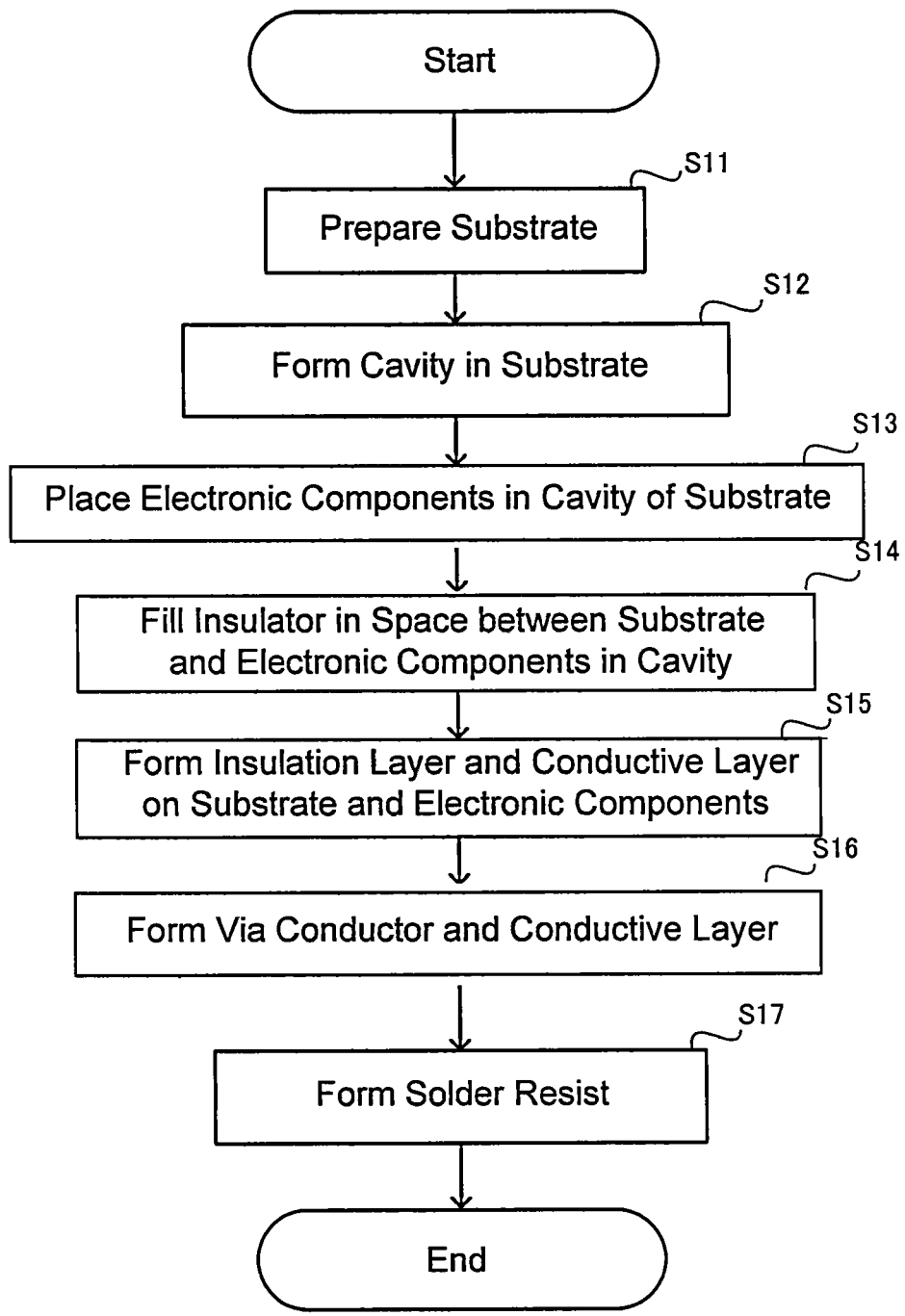
FIG. 9 is a flowchart showing a method for manufacturing a wiring board according to the embodiment of the present invention.

In the following, a method for manufacturing wiring board 10 is described with reference to FIG. 9 and others. FIG. 9 is a flowchart schematically showing the contents and procedures of a method for manufacturing wiring board 10 according to the present embodiment.

In step (S11), a core section made of substrate 100 or the like is formed.

Figure 10A:
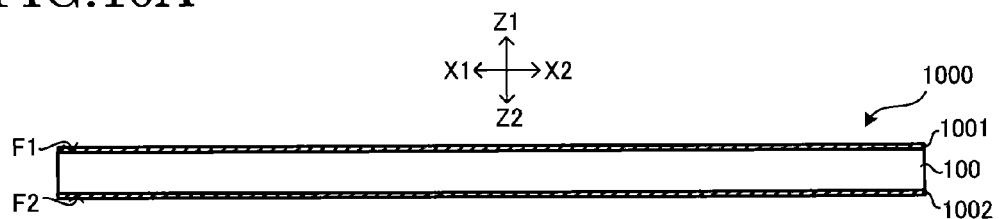
FIG. 10A is a view illustrating a first step for forming a core section in the manufacturing method shown in FIG. 9.

Specifically, double-sided copper-clad laminate 1000 is prepared as a starting material as shown in FIG. 10A. Double-sided copper-clad laminate 1000 is formed with substrate 100 (core substrate), copper foil 1001 formed on first surface (F1) of substrate 100, and copper foil 1002 formed on second surface (F2) of substrate 100. In the present embodiment, substrate 100 at this stage is made of completely cured glass epoxy.

Figure 10B:
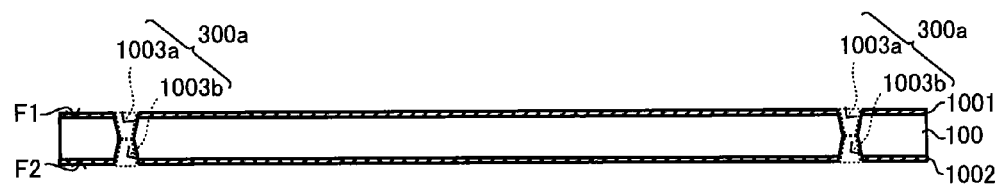
FIG. 10B is a view illustrating a second step for forming a core section in the manufacturing method shown in FIG. 9.

As shown in FIG. 10B, a $CO_2$ laser, for example, is used to irradiate double-sided copper-clad laminate 1000 from the first-surface (F1) side to form hole (1003a), and to irradiate double-sided copper-clad laminate 1000 from the second-surface (F2) side to form hole (1003b). Hole (1003a) and hole (1003b) are formed at substantially the same position on the X-Y plane, and are finally connected to become through hole (300a) which penetrates through double-sided copper-clad laminate 1000. Through hole (300a) is shaped like an hourglass, for example. The boundary of hole (1003a) and hole (1003b) corresponds to narrowed portion (300c) (FIG. 1). Laser irradiation on first surface (F1) and laser irradiation on second surface (F2) may be conducted simultaneously or separately. Desmearing is preferred to be conducted on through hole (300a) after it is formed. Unwanted conduction (short circuiting) is suppressed by desmearing. In addition, to enhance the absorption efficiency of laser light, a black-oxide treatment may be conducted on surfaces of copper foils (1001, 1002) prior to laser irradiation. Through hole (300a) may be formed using a drill or by etching instead of using a laser. However, fine processing may be achieved using a laser.

Figure 10C:
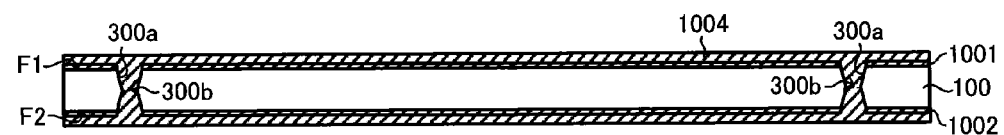
FIG. 10C is a view illustrating a third step for forming a core section in the manufacturing method shown in FIG. 9.

By a panel plating method, for example, copper plating 1004, for example, is formed on copper foils (1001, 1002) and in through hole (300a) as shown in FIG. 10C. Specifically, electroless plating is first performed, and plating 1004 is formed using the electroless plated film as a seed layer when performing electrolytic plating using a plating solution. Accordingly, plating 1004 is filled in through hole (300a) to form through-hole conductor (300b).

Figure 10D:
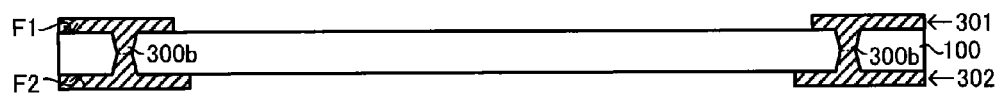
FIG. 10D is a view illustrating a fourth step for forming a core section in the manufacturing method shown in FIG. 9.

Using an etching resist and etching solution, for example, conductive layers formed respectively on first surface (F1) and second surface (F2) of substrate 100 are patterned. Specifically, each conductive layer is covered by an etching resist with a pattern corresponding to conductive layer 301 or 302. Then, portions of each conductive layer which are not covered by the etching resist are etched away (portions exposed through opening portions of the etching resist). Accordingly, conductive layers (301, 302) are formed respectively on first surface (F1) and second surface (F2) of substrate 100 as shown in FIG. 10D. As a result, the core section of wiring board 10 (FIG. 1) is completed. In the present embodiment, conductive layers (301, 302) are each triple-layered with, for example, copper foil (lower layer), electroless copper plating (middle layer) and electrolytic copper plating (upper layer).

Etching is not limited to being a wet type, and may be a dry type. In addition, roughening surfaces of conductive layers (301, 302) through etching or the like is preferable, if required. Also, alignment marks may be formed on conductive layer 301 or 302 to be used in a later step (step for positioning electronic components (200a, 200b) and the like).

Figure 11:
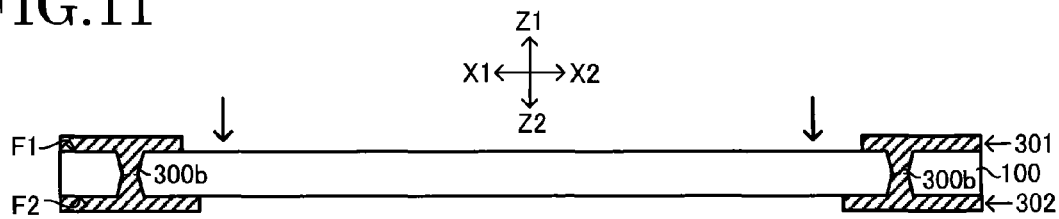
FIG. 11 is a view illustrating a step for forming a cavity in the manufacturing method shown in FIG. 9.
Figure 12A:
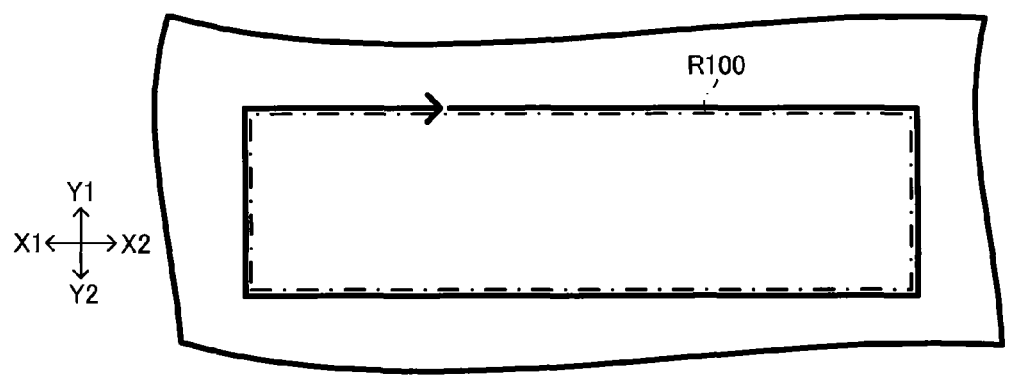
FIG. 12A is a view illustrating a first step for forming a cavity in the manufacturing method shown in FIG. 9.

In step (S12) of FIG. 9, laser light is irradiated at substrate 100 from the first-surface (F1) side as shown in FIG. 11, for example, to form cavity (R10). Specifically, as shown in FIG. 12A, for example, by irradiating laser light to draw the shape of cavity (R10) (see FIG. 4), region (R100) of substrate 100 corresponding to cavity (R10) is cut out from its surroundings. The irradiation angle of laser light is set to be substantially perpendicular to first surface (F1) of substrate 100, for example.

Figure 12B:
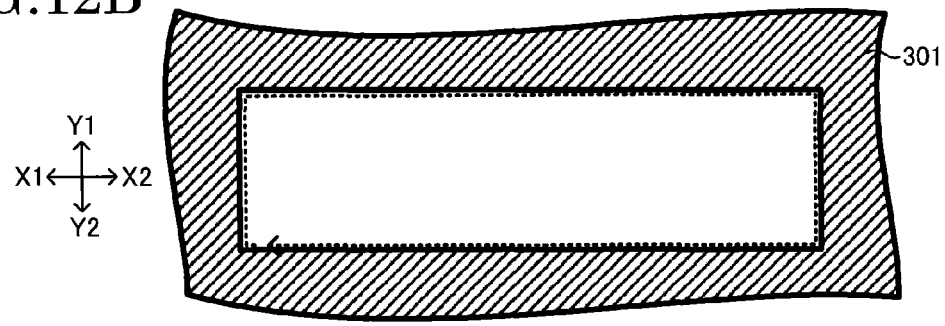
FIG. 12B is a view illustrating a second step for forming a cavity in the manufacturing method shown in FIG. 9.
Figure 12C:
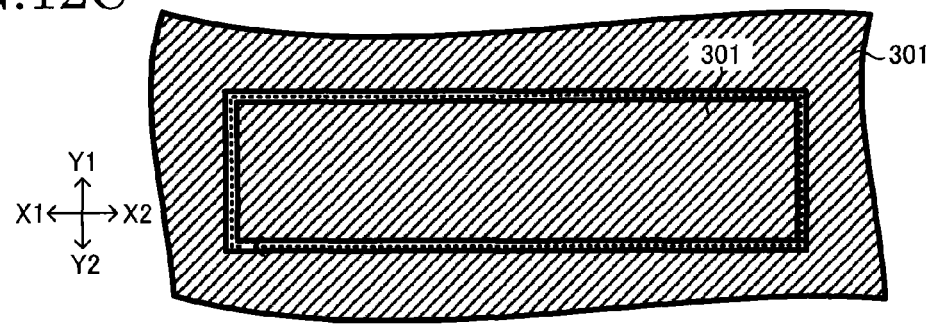
FIG. 12C is a view illustrating a third step for forming a cavity in the manufacturing method shown in FIG. 9.

Prior to the above laser irradiation, conductive layer 301 on substrate 100 may be removed as shown in FIG. 12B to correspond to the shape of cavity (R10), or may be removed as shown in FIG. 12C along the laser irradiation route. In doing so, the position and shape of cavity (R10) become clear, making alignment easier during laser irradiation.

Figure 13:
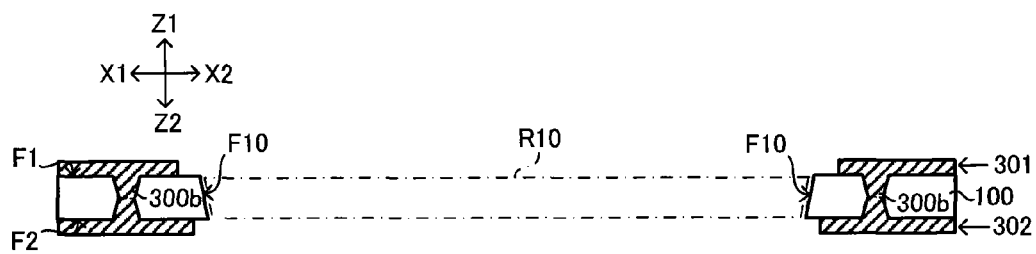
FIG. 13 is, in the manufacturing method shown in FIG. 9, a view showing a core substrate after a cavity has been formed.

As shown in FIG. 13, cavity (R10) is formed by the above irradiation of laser light. In the present embodiment, by irradiating laser light at substrate 100 from the first-surface (F1) side, the amount of laser processing decreases as the light proceeds toward the second-surface (F2) side. Accordingly, cavity (R10) is formed with its width becoming smaller from first surface (F1) toward second surface (F2). As a result, the cut surfaces of substrate 100 are tapered. In the present embodiment, wall surfaces (F10) of cavity (R10) are cut surfaces (tapered surfaces) of substrate 100.

Cavity (R10) formed as above is space for accommodating electronic components (200a, 200b). In the present embodiment, since cavity (R10) is formed by a laser, it is easier to obtain cavity (R10) having tapered wall surfaces (F10). However, a method for forming cavity (R10) is not limited to using a laser, and it may be formed by any other method such as using a die.

In step (S13) of FIG. 9, electronic components (200a, 200b) are positioned in cavity (R10) of substrate 100.

Figure 14:
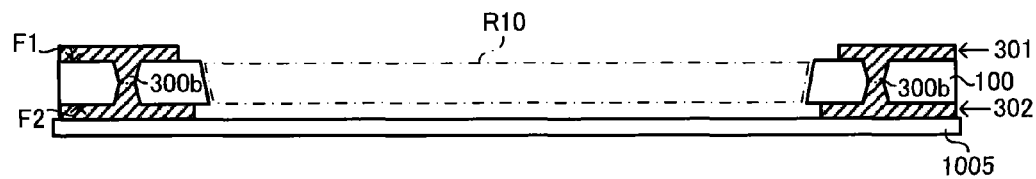
FIG. 14 is, in the manufacturing method shown in FIG. 9, a view illustrating a step for attaching to a carrier a core substrate where a cavity is formed.

Specifically, as shown in FIG. 14, carrier 1005 made of PET (polyethylene terephthalate), for example, is placed on one side (second surface (F2), for example) of substrate 100. Accordingly, one opening of cavity (R10) (hole) is covered by carrier 1005. In the present embodiment, carrier 1005 is made of an adhesive sheet (tape, for example), and is adhesive on the side facing substrate 100. Carrier 1005 is adhered to substrate 100 through lamination, for example.

Figure 15:
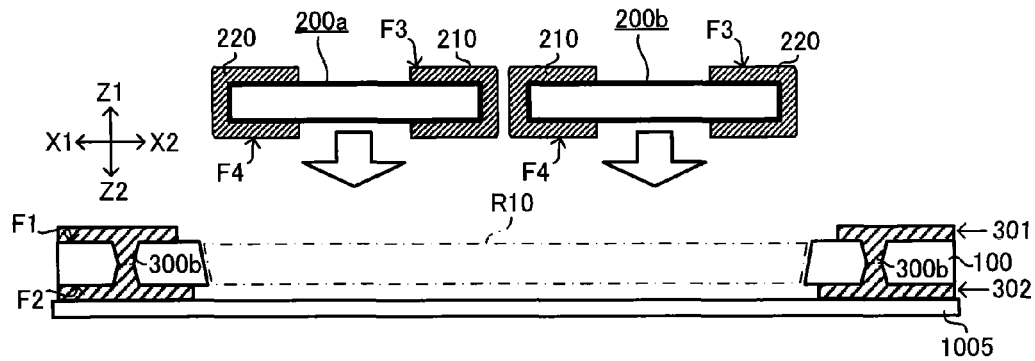
FIG. 15 is, in the manufacturing method shown in FIG. 9, a view illustrating a step for positioning multiple electronic components in the cavity.
Figure 16:
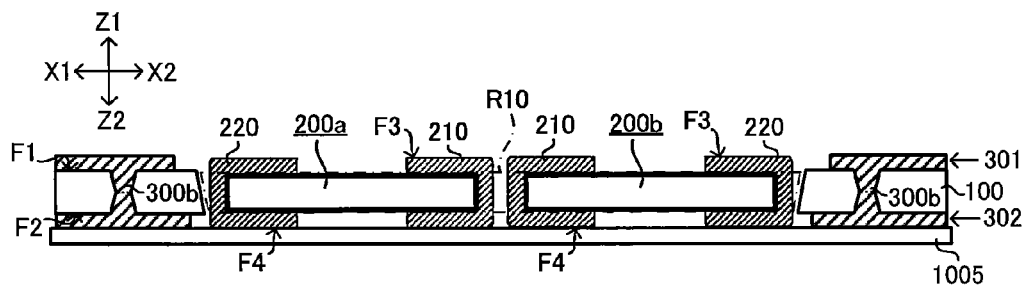
FIG. 16 is, in the manufacturing method shown in FIG. 9, a view showing a state where multiple electronic components are positioned in the cavity.

As shown in FIG. 15, electronic components (200a, 200b) are placed in cavity (R10) from the opening (Z1 side) opposite the covered opening of cavity (R10) (hole). Electronic components (200a, 200b) are each placed in cavity (R10) using a component mounter, for example. Electronic components (200a, 200b) are each held by vacuum chuck or the like, for example, transported to the region above cavity (R10) (Z1 side), lowered along a vertical direction, and placed in cavity (R10). Electronic components (200a, 200b) are positioned in cavity (R10) in such a way that electrode 210 (especially, first side portion (210b) shown in FIG. 3B and others) and electrode 220 (especially, second side portion (220b) shown in FIG. 3B and others) of electronic component (200a) are arrayed on substantially a straight line (on straight line (L) in FIG. 4, for example) with electrode 210 (especially, first side portion (210b)) and electrode 220 (especially, second side portion (220b)) of electronic component (200b), while electrodes 210 (especially their first side portions (210b)) face each other. Accordingly, as shown in FIG. 16, electronic components (200a, 200b) are positioned on carrier 1005 (adhesive sheet) to be adjacent to each other.

Figure 17:
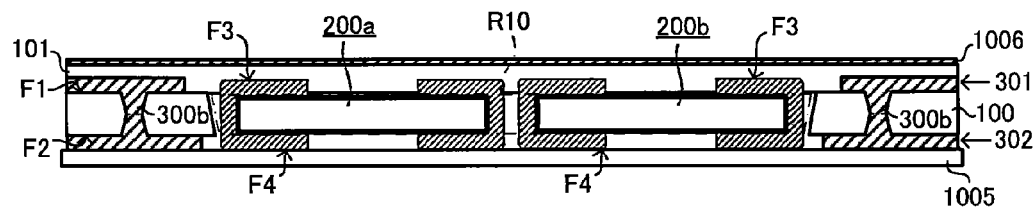
FIG. 17 is, in the manufacturing method shown in FIG. 9, a view illustrating a step for forming a first interlayer insulation layer and a first copper foil on the insulative substrate and on the electronic components.
Figure 18:
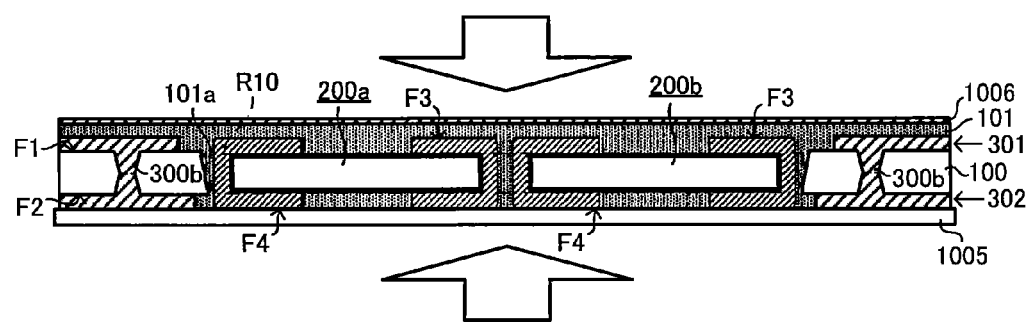
FIG. 18 is a view illustrating a pressing step in the manufacturing method shown in FIG. 9.
Figure 19:
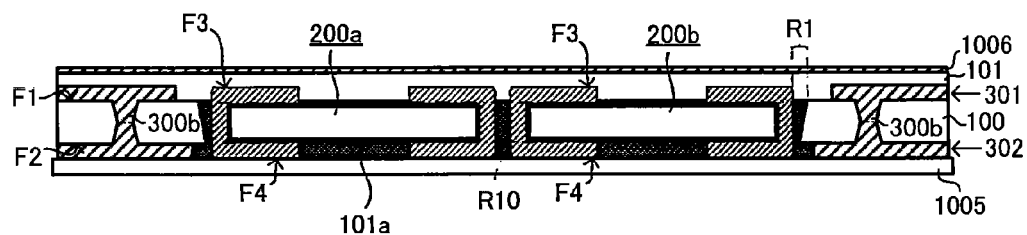
FIG. 19 is a view showing a state after the pressing in FIG. 18.

In step (S14) of FIG. 9, semicured insulation layer 101 is formed on first surface (F1) of substrate 100 and third surfaces (F3) of electronic components (200a, 200b), which is the side (Z1 side) opposite the covered opening of cavity (R10) (hole) as shown in FIG. 17. Then, copper foil 1006 is formed on insulation layer 101. Insulation layer 101 is made of prepreg of thermosetting epoxy resin, for example. By pressing semicured insulation layer 101 as shown in FIG. 18, resin flows out from insulation layer 101 into cavity (R10) as shown in FIG. 18. Accordingly, as shown in FIG. 19, insulator (101a) (the resin from insulation layer 101) is filled between electronic components (200a, 200b) in cavity (R10) and substrate 100 and between electronic component (200a) and electronic component (200b).

After insulator (101a) is filled in cavity (R10), the filler resin (insulator (101a)) and electronic components (200a, 200b) are preliminarily adhered. Specifically, the filler resin is heated to achieve strength to such a degree that it can hold electronic components (200a, 200b). Accordingly, electronic components (200a, 200b) held by carrier 1005 are now held by the filler resin. Then, carrier 1005 is removed.

At this stage, insulator (101a) (filler resin) and insulation layer 101 are not completely cured, but are semicured. However, that is not the only option, and insulator (101a) and insulation layer 101 may be completely cured at this stage, for example.

In step (S15) of FIG. 9, a buildup section is formed on the second-surface (F2) side of substrate 100.

Figure 20:
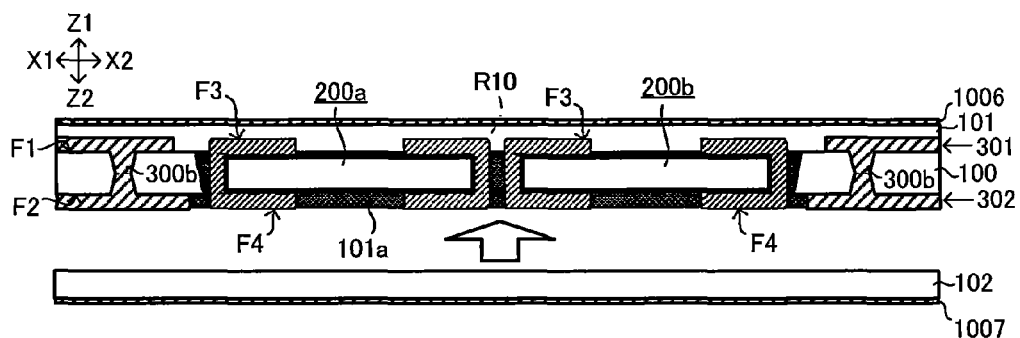
FIG. 20 is, in the manufacturing method shown in FIG. 9, a view illustrating a step for forming a second interlayer insulation layer and a second copper foil on the insulative substrate and on the electronic components after the carrier is removed.

Specifically, as shown in FIG. 20, insulation layer 102 and copper foil 1007 are formed on second surface (F2) of substrate 100. Electrodes (210, 220) of electronic components (200a, 200b) are each covered by insulation layer 102. After insulation layer 102 as prepreg is adhered to substrate 100 by pressing, for example, insulation layers (101, 102) are heated to be cured. In the present embodiment, since resin filled in cavity (R10) is cured after the adhesive sheet (carrier 1005) is removed, insulation layers (101, 102) are cured at the same time. Then, by simultaneously curing insulation layers (101, 102) on both surfaces, warping of substrate 100 is suppressed and making substrate 100 thinner is easier.

Via conductors and conductive layers are formed in step (S16) of FIG. 9.

Figure 21:
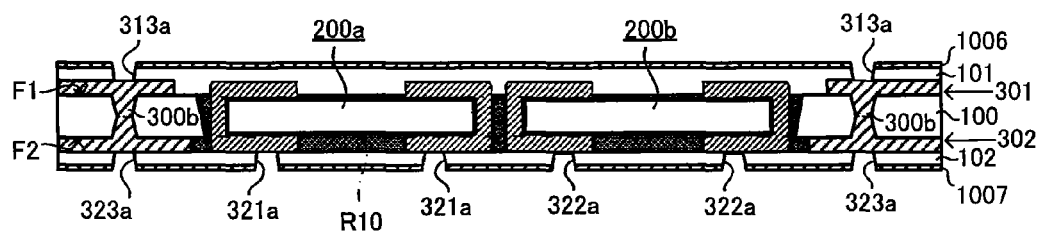
FIG. 21 is, in the manufacturing method shown in FIG. 9, a view illustrating a first step for forming conductive layers on the first and second interlayer insulation layers and for electrically connecting each conductive layer and electrodes of the electronic components.

Specifically, as shown in FIG. 21, by using a laser, for example, hole (313a) (via hole) is formed in insulation layer 101 and copper foil 1006, and holes (321a~323a) (each a via hole) are formed in insulation layer 102 and copper foil 1007. Hole (313a) penetrates through copper foil 1006 and insulation layer 101, and holes (321a~323a) each penetrate through copper foil 1007 and insulation layer 102. Then, hole (321a) reaches electrode 210 or 220 of electronic component (200a), and hole (322a) reaches electrode 210 or 220 of electronic component (200b). Also, holes (313a, 323a) respectively reach conductive layers (301, 302) directly on through-hole conductor (300b). Then, desmearing is conducted if required.

Figure 22:
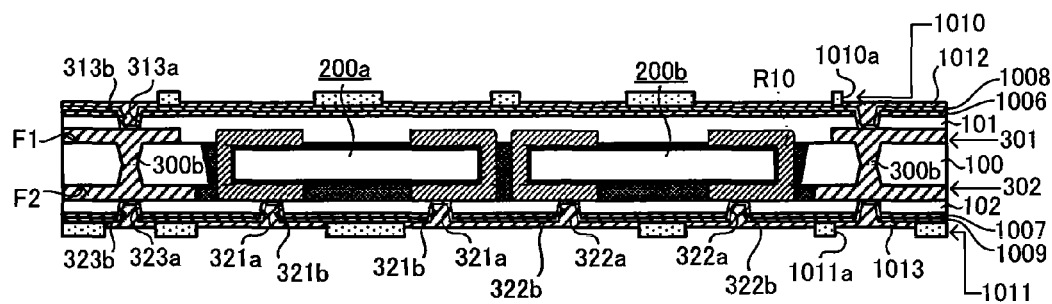
FIG. 22 is a view illustrating a second step subsequent to the step in FIG. 21.

Using a chemical plating method, for example, electroless copper-plated films (1008, 1009), for example, are formed on copper foils (1006, 1007) and in holes (313a, 321a~323a) (see FIG. 22). Prior to electroless plating, a catalyst made of palladium or the like may be adsorbed on surfaces of insulation layers (101, 102) through immersion, for example.

Figure 23:
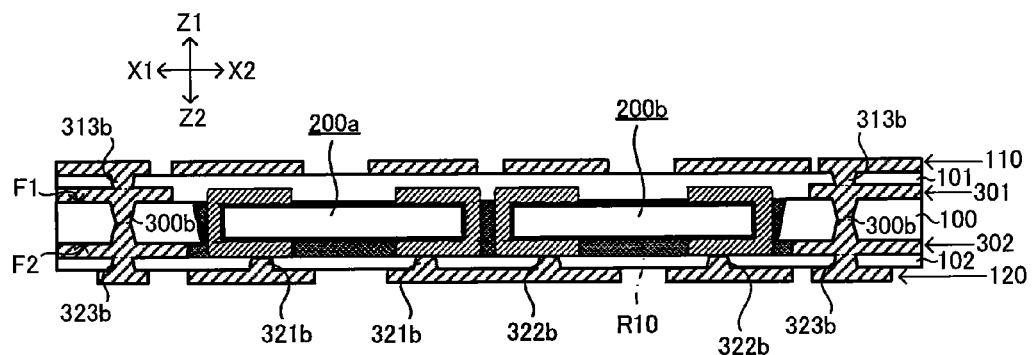
FIG. 23 is a view illustrating a third step subsequent to the step in FIG. 22.

Using a lithographic technique, printing or the like, plating resist 1010 with opening portions (1010a) is formed on the first-surface (F1) side main surface (on electroless plated film 1008), and plating resist 1011 with opening portions (1011a) is formed on the second-surface (F2) side main surface (on electroless plated film 1009) (see FIG. 22). Opening portions (1010a, 1011a) have patterns corresponding respectively to conductive layers (110, 120) (FIG. 23).

As shown in FIG. 22, using a pattern plating method, for example, electrolytic copper platings (1012, 1013), for example, are formed respectively in opening portions (1010a, 1011a) of plating resists (1010, 1011). Specifically, copper as the plating material is connected to the anode, and electroless plated films (1008, 1009) as the material to be plated are connected to the cathode, and the substrate is immersed in a plating solution. Then, DC voltage is applied between both electrodes so that copper is deposited on surfaces of electroless plated films (1008, 1009). In doing so, holes (313a, 321a~323a) are filled respectively with electroless plated films (1008, 1009) and electrolytic platings (1012, 1013). Accordingly, via conductors (313b, 321b~323b) made of copper plating, for example, are formed.

Then, using a predetermined removing solution, for example, plating resists (1010, 1011) are removed, and unnecessary electroless plated films (1008, 1009) and copper foils (1006, 1007) are further removed. Accordingly, conductive layers (110, 120) are formed as shown in FIG. 23. Conductive layer 120 includes wiring (W1) (FIG. 7). Because of wiring (W1), opposing side electrodes (electrode 210 of electronic component (200a) and electrode 210 of electronic component (200b)) are set to have substantially the same electric potential as each other.

The seed layer for electrolytic plating is not limited to electroless plated film. Instead of electroless plated films (1008, 1009), sputtered film or the like may be used as a seed layer.

In step (S17) of FIG. 9, solder resist 11 having opening portions (11a) and solder resist 12 having opening portions (12a) are formed respectively on insulation layers (101, 102) (see FIG. 1). Conductive layers (110, 120) are covered respectively by solder resists (11, 12) except for predetermined portions positioned at opening portions (11a, 12a) (pads (P11, P12) or the like). Solder resists (11, 12) are formed by screen printing, spray coating, roll coating, lamination or the like, for example.

By electrolytic plating, sputtering or the like, anticorrosion layers made of Ni/Au, for example, are formed on conductive layers (110, 120), in particular, on surfaces of pads (P11, P12) which are not covered by solder resists (11, 12) (see FIG. 1). Alternatively, anticorrosion layers made of organic protective film may be formed by performing an OSP treatment.

Accordingly, a buildup section made up of insulation layer 101 and conductive layer 110 is formed on first surface (F1) of substrate 100, and a buildup section made up of insulation layer 102 and conductive layer 120 is formed on second surface (F2) of substrate 100. As a result, wiring board 10 (FIG. 1) of the present embodiment is completed. Then, electrical testing (to check capacitance, insulation and so forth) is conducted on electronic components (200a, 200b), if required.

The manufacturing method of the present embodiment is suitable for manufacturing wiring board 10. Using such a manufacturing method, an excellent wiring board 10 is thought to be obtained at low cost.

Figure 24:
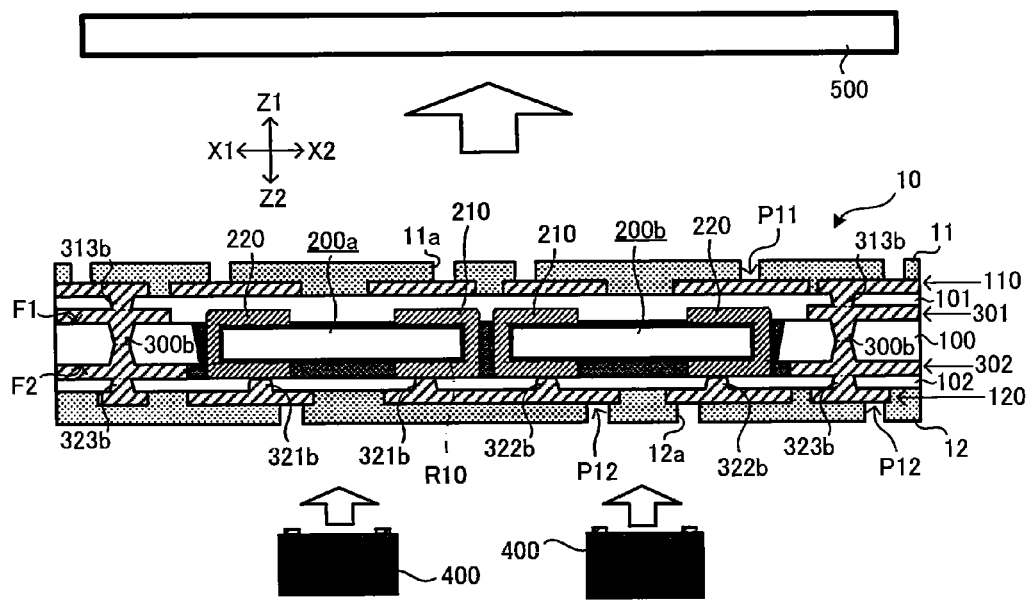
FIG. 24 is a view illustrating a step for mounting electronic components on surfaces of a wiring board according to the embodiment of the present invention.

Wiring board 10 of the present embodiment can be electrically connected to an electronic component or another wiring board, for example. As shown in FIG. 24, for example, electronic component 400 (such as an IC chip) may be mounted on pads (P12) of wiring board 10 through soldering or the like. Also, wiring board 10 may be mounted on another wiring board 500 (such as a motherboard) through pads (P11). Wiring board 10 of the present embodiment can be used as a circuit board of a mobile device such as a cell phone or the like.

The present invention is not limited to the above embodiment, and may be modified as follows, for example.

Figure 25A:
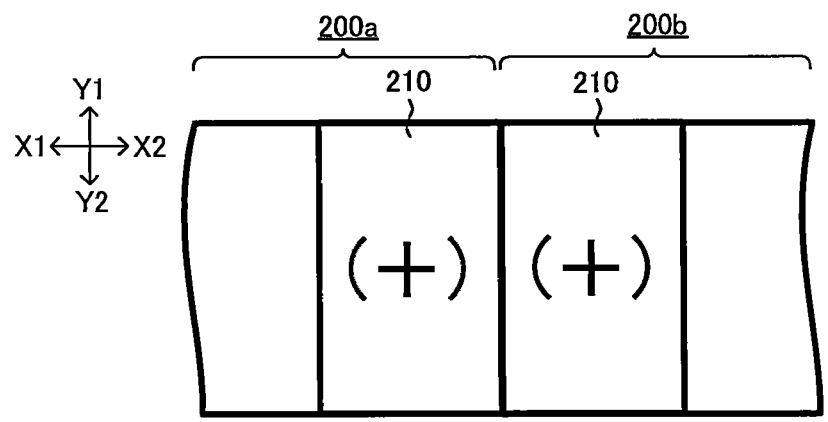
FIG. 25A is, in another embodiment of the present invention, a view illustrating a first example of a wiring board in which opposing side electrodes of adjacent electronic components are in contact with each other.
Figure 25B:
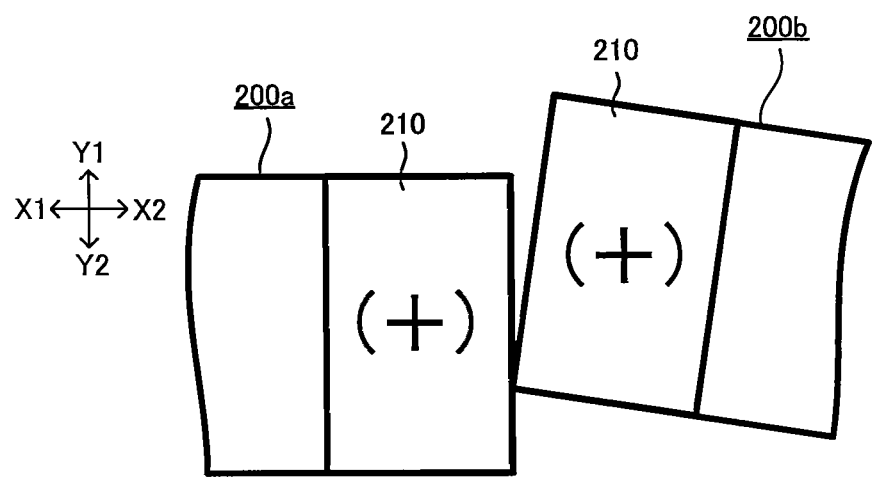
FIG. 25B is, in yet another embodiment of the present invention, a view illustrating a second example of a wiring board in which opposing side electrodes of adjacent electronic components are in contact with each other.

To connect opposing side electrodes in cavity (R10) (opening section) with each other through wiring is not the structure always required to set those side electrodes at substantially the same electric potential as each other. For example, the opposing side electrodes may be connected to separate power sources which have substantially the same electric potential. Alternatively, as shown in FIG. 25A or 25B, opposing electrodes (210, 210) of electronic components (200a, 200b) adjacent in cavity (R10) may be in contact with each other. By electrically connecting opposing side electrodes (electrode 210 of electronic component (200a) and electrode 210 of electronic component (200b)) in advance, electric potential is less likely to vary when those side electrodes make contact.

In the example shown in FIG. 25A, opposing electrodes (210, 210) are in contact along a surface. In the example shown in FIG. 25B, opposing electrodes (210, 210) are in contact on a line or at a point.

Figure 26A:
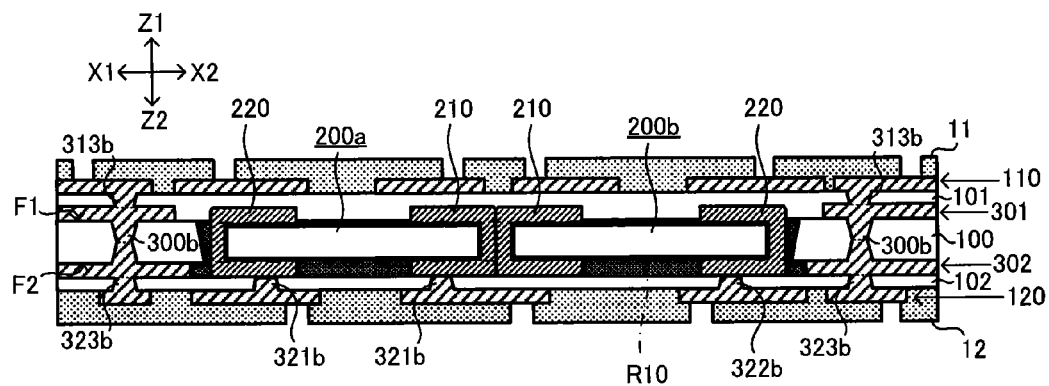
FIG. 26A is, in yet another embodiment of the present invention, a cross-sectional view illustrating a wiring board which has a via conductor connected to one of the opposing side electrodes of adjacent electronic components, but which does not have a via conductor connected to the other.
Figure 26B:
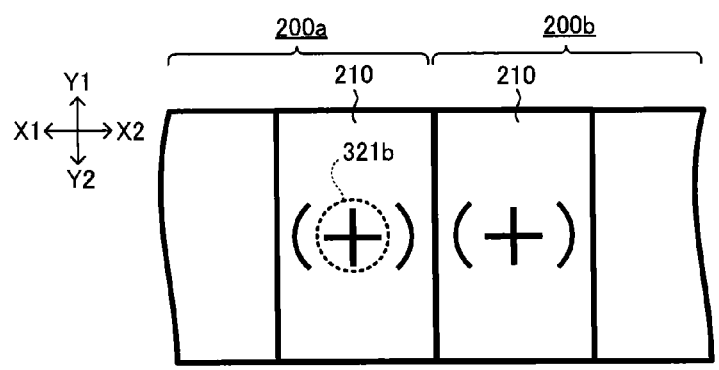
FIG. 26B is a view showing the position of a via conductor in the wiring board shown in FIG. 26A.

When opposing electrodes (210, 210) are in contact, electrode 210 of electronic component (200a) and electrode 210 of electronic component (200b) are electrically connected to each other. Therefore, as shown in FIGS. 26A and 26B, for example, via conductor (321b) connected to electrode 210 of electronic component (200a) or via conductor (322b) connected to electrode 210 of electronic component (200b) may be omitted. In the example shown in FIGS. 26A and 26B, via conductor (322b) is omitted.

Figure 27A:
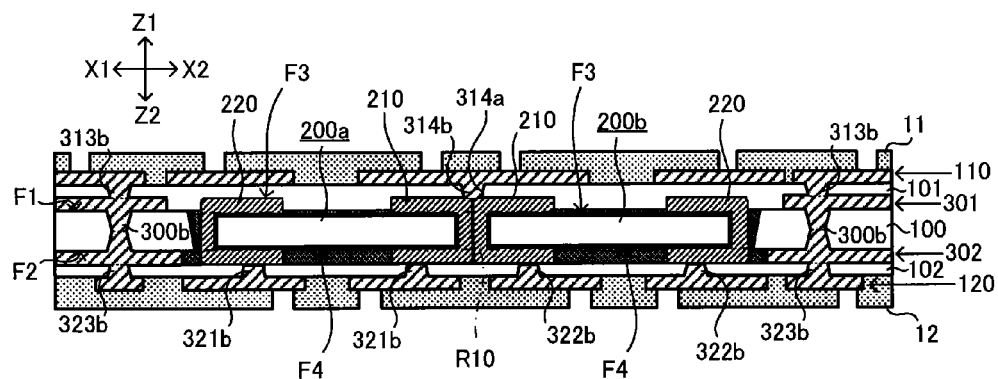
FIG. 27A is, in yet another embodiment of the present invention, a cross-sectional view showing a wiring board having a via conductor which is positioned on either the upper or lower surfaces of adjacent electronic components to be connected to both opposing side electrodes of the electronic components.

As shown in FIG. 27A, the wiring board may have via conductor (314b) which is connected to both opposing electrodes (210, 210) of electronic components (200a, 200b) adjacent in cavity (R10) from the third-surface (F3) side of electronic components (200a, 200b). Hole (314a) (via hole) is formed in insulation layer 101 to reach both opposing electrodes (210, 210), and a conductor (such as copper plating) is filled in hole (314a) so that the conductor in hole (314a) becomes via conductor (314b) (filled conductor).

Figure 27B:
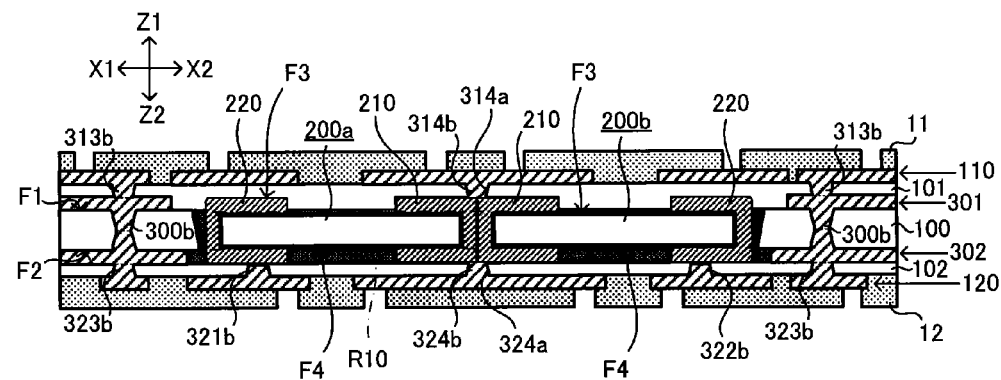
FIG. 27B is, in yet another embodiment of the present invention, a cross-sectional view showing a wiring board having via conductors which are respectively positioned on both the upper and lower surfaces of adjacent electronic components to be connected to both opposing side electrodes of the electronic components.

In addition to via conductor (314b), the wiring board may also have via conductor (324b) which is connected to both opposing electrodes (210, 210) of electronic components (200a, 200b) from the fourth-surface (F4) side of electronic components (200a, 200b) as shown in FIG. 27B. Hole (324a) (via hole) is formed in insulation layer 102 to reach both opposing electrodes (210, 210), and a conductor (such as copper plating) is filled in hole (324a) so that the conductor in hole (324a) becomes via conductor (324b) (filled conductor).

Figure 28A:
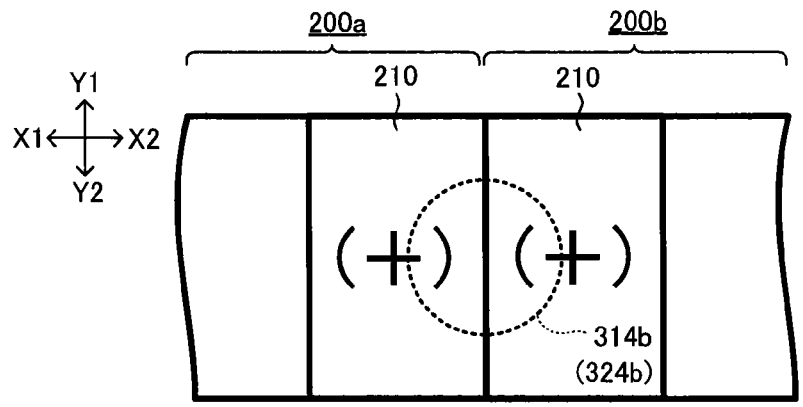
FIG. 28A is, in yet another embodiment of the present invention, a view illustrating a first example of a via conductor connected to both opposing side electrodes of adjacent electronic components.
Figure 28B:
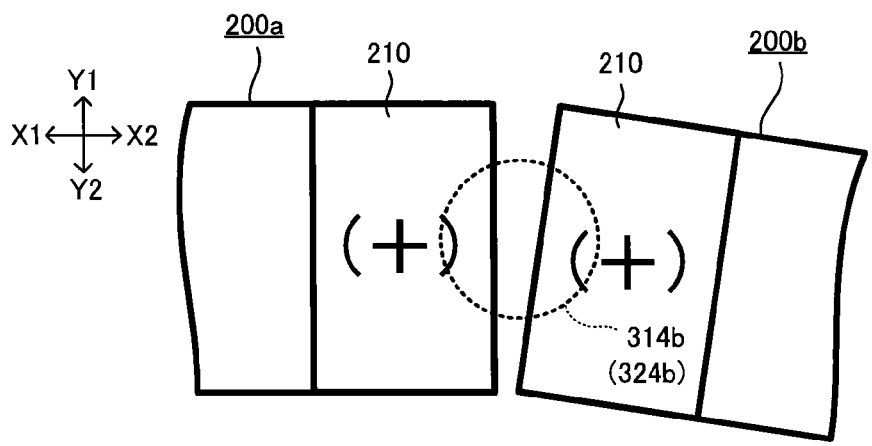
FIG. 28B is, in yet another embodiment of the present invention, a view illustrating a second example of a via conductor connected to both opposing side electrodes of adjacent electronic components.
Figure 28C:
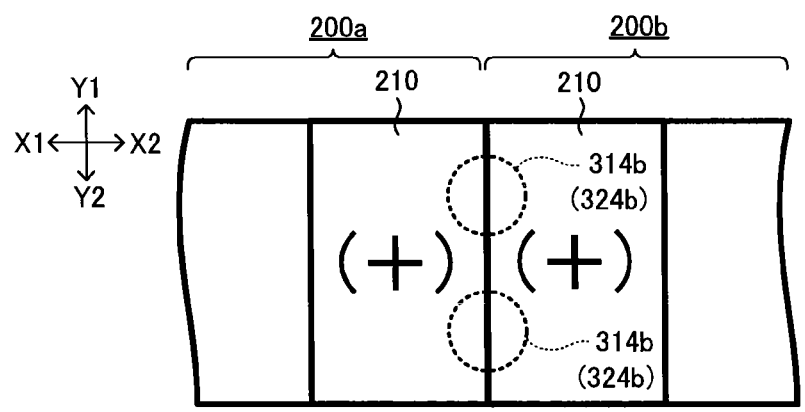
FIG. 28C is, in yet another embodiment of the present invention, a view illustrating a third example of via conductors connected to both opposing side electrodes of adjacent electronic components.

As shown in FIGS. 28A-28C, for example, via conductor (314b) or (324b) is positioned in the boundary between electrode 210 of electronic component (200a) and electrode 210 of electronic component (200b).

In the example shown in FIG. 28A, electrode 210 of electronic component (200a) and electrode 210 of electronic component (200b) are in contact, and via conductor (314b) or (324b) is positioned on the boundary line of electrodes (210, 210). For example, via conductor (314b) or (324b) is positioned in the center of electrodes (210, 210) so that the area in contact with electrode 210 of electronic component (200a) is equal to the area in contact with electrode 210 of electronic component (200b).

In the example shown in FIG. 28B, electrode 210 of electronic component (200a) and electrode 210 of electronic component (200b) are separate from each other, and via conductor (314b) or (324b) connects both electrodes (210, 210) by bridging the space between electrodes (210, 210).

In the example shown in FIG. 28C, multiple (two, for example) via conductors (314b) or (324b) are formed along the boundary between electrode 210 of electronic component (200a) and electrode 210 of electronic component (200b).

Figure 29A:
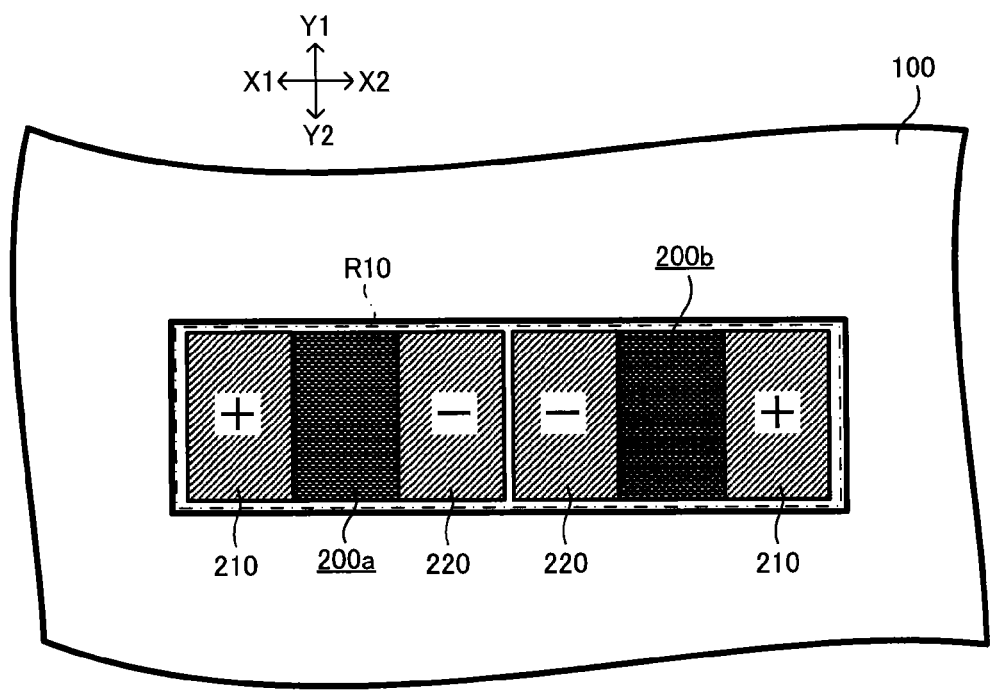
FIG. 29A is, in yet another embodiment of the present invention, a view illustrating an example in which negative electrodes of adjacent electronic components face each other.
Figure 29B:
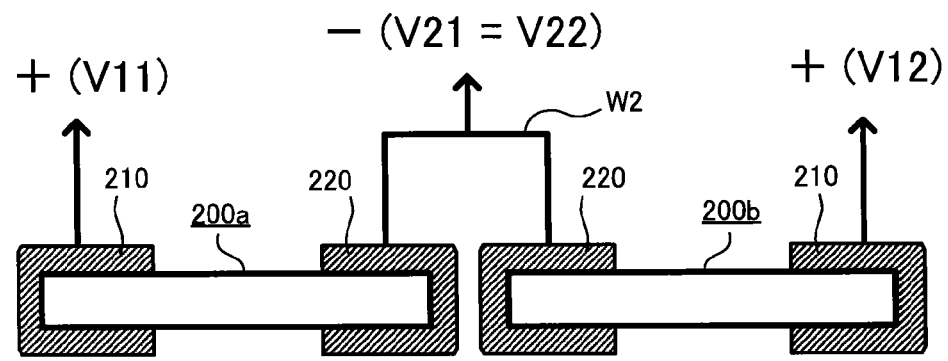
FIG. 29B is, in the wiring board shown in FIG. 29A, a view illustrating an example in which opposing electrodes of adjacent electronic components are electrically connected to each other through wiring.

In the above embodiment, electrodes 210 with positive polarity face each other in cavity (R10). However, that is not the only option. For example, electrodes 220 with negative polarity may face each other as shown in FIG. 29A. Then, as shown in FIG. 29B, for example, the wiring board may have wiring (W2) to electrically connect opposing electrodes 220 of electronic component (200a) and electronic component (200b). By electrically connecting the opposing side electrodes (electrode 220 of electronic component (200a) and electrode 220 of electronic component (200b)) in advance, electric potential is less likely to vary when those side electrodes make contact.

Figure 30:
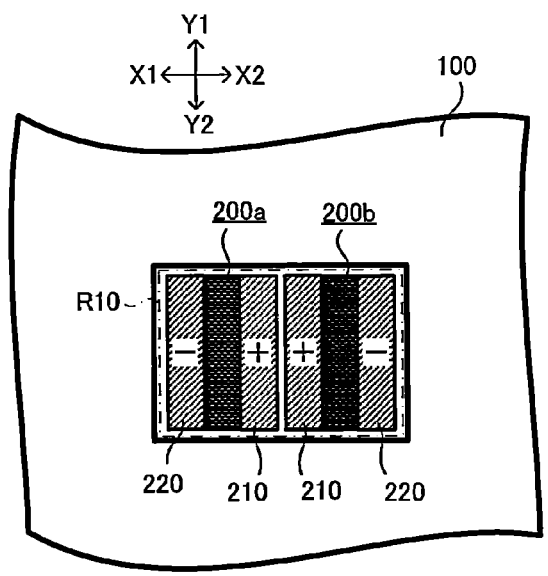
FIG. 30 is, in yet another embodiment of the present invention, a view illustrating an example in which adjacent electronic components in an opening section each have a pair of side electrodes arrayed in a lateral direction.

In the above embodiment, electrodes (210, 220) of each electronic component are arrayed along a longitudinal direction of electronic components (200a, 200b). However, that is not the only option. For example, electrodes (210, 220) of each electronic component may be arrayed along a lateral direction of electronic components (200a, 200b) as shown in FIG. 30.

In the above embodiment, the number of electronic components positioned in cavity (R10) (opening section) is two (electronic components (200a, 200b)). However, that is not the only option. The number of electronic components positioned in cavity (R10) (opening section) is not limited specifically as long as it is more than one. For example, as shown in FIG. 31 or 32, three or more electronic components may be positioned in one cavity (R10).

Figure 31:
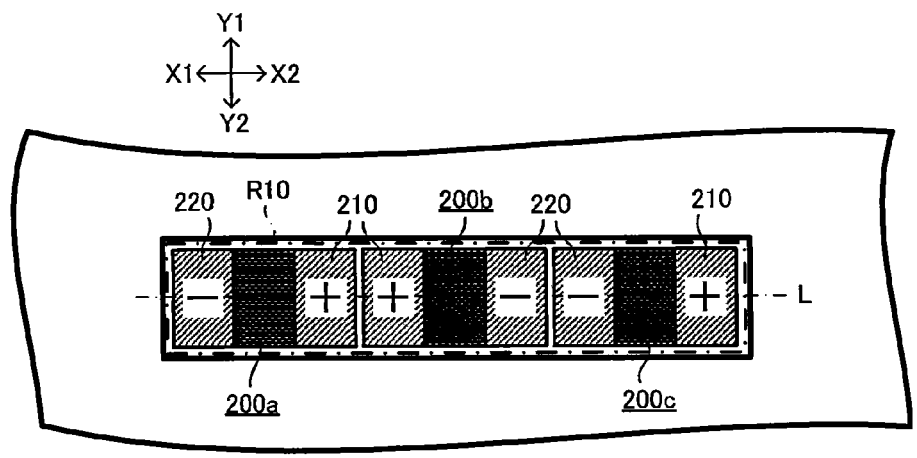
FIG. 31 is, in yet another embodiment of the present invention, a view illustrating an example in which three electronic components are arrayed along one direction in an opening section.

In the example in FIG. 31, electronic components (200a, 200b, 200c) (first electronic component, second electronic component, third electronic component) are accommodated in cavity (R10). Electronic components (200a, 200b, 200c) are each a chip capacitor with the structure shown in FIGS. 2A-3B, for example.

Figure 32:
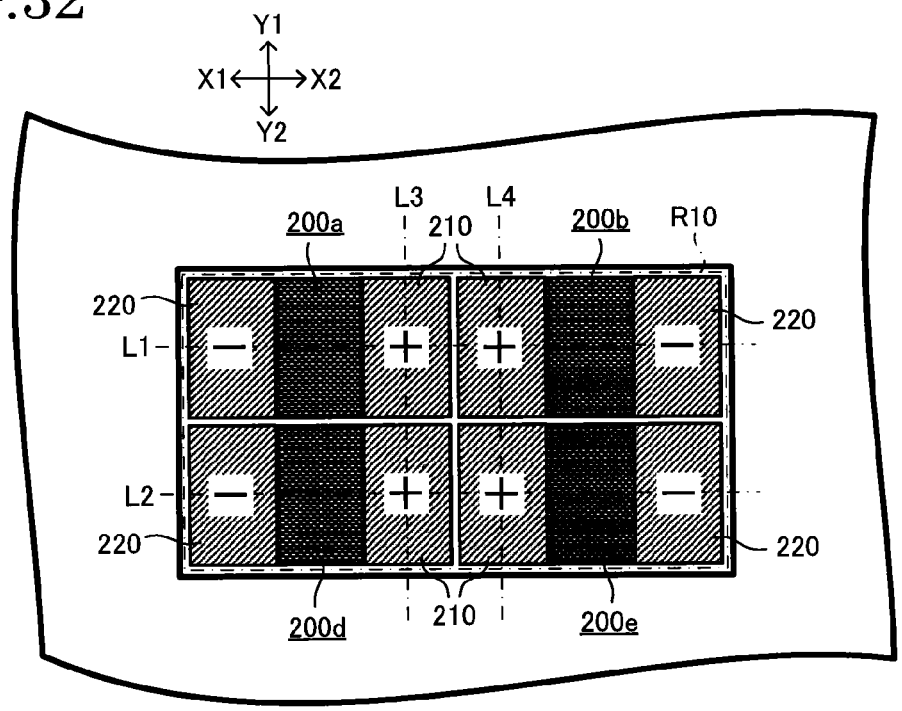
FIG. 32 is, in yet another embodiment of the present invention, a view illustrating an example in which a side electrode of an electronic component positioned in an opening section faces side electrodes of other electronic components in three directions.

The following is arrayed on substantially a straight line (on straight line (L) in FIG. 32, for example): electrode 210 (especially, first side portion (210b)) and electrode 220 (especially, second side portion (220b)) of electronic component (200a) (first electronic component); electrode 210 (especially, first side portion (210b)) and electrode 220 (especially, second side portion (220b)) of electronic component (200b) (second electronic component); and electrode 210 (especially, first side portion (210b)) and electrode 220 (especially, second side portion (220b)) of electronic component (200c) (third electronic component). Electrode 210 (especially, first side portion (210b)) of electronic component (200a) and electrode 210 (especially, first side portion (210b)) of electronic component (200b) face each other, and are set to have substantially the same electric potential. Also, electrode 220 (especially, second side portion (220b)) of electronic component (200b) and electrode 220 (especially, second side portion (220b)) of electronic component (200c) face each other, and are set to have substantially the same electric potential.

All the electronic components (electronic components (200a, 200b, 200c)) positioned in cavity (R10) are arrayed along one direction (direction X), and those electronic components each have a pair of side electrodes (electrodes (210, 220) arrayed in the direction (direction X) along which those electronic components are arrayed. Among the electronic components positioned in cavity (R10), electronic component (200a) is positioned so as to be adjacent only to one of the other electronic components (electronic component (200b)). The opposing electrodes (210, 210) of electronic components (200a, 200b) are set to have the same electric potential as each other. Namely, the electric potential at electrode 210 of electronic component (200a) and the electric potential at electrode 210 of electronic component (200b) have the same polarity (positive polarity) as each other, and their absolute values are substantially equal. Also, electronic component (200c) is positioned to be adjacent to only one of the other electronic components (electric component (200b)), and the opposing electrodes (220, 220) of such electronic components (200c, 200b) are set to have the same electric potential as each other. Namely, the electric potential at electrode 220 of electronic component (200c) and the electric potential at electrode 220 of electronic component (200b) have the same polarity (negative polarity), and their absolute values are substantially equal.

In the example shown in FIG. 32, electronic components (200a, 200b, 200d, 200e) (first electronic component, second electronic component, fourth electronic component, fifth electronic component) are accommodated in cavity (R10). Electronic components (200a, 200b, 200d, 200e) are each a chip capacitor with the structure shown in FIGS. 2A~3B, for example.

Electrode 210 (especially, first side portion (210b)) and electrode 220 (especially, second side portion (220b)) of electronic component (200a) (first electronic component) are arrayed on substantially a straight line (on straight line (L1) in FIG. 32, for example) with electrode 210 (especially, first side portion (210b)) and electrode 220 (especially, second side portion (220b)) of electronic component (200b) (second electronic component). In addition, electrode 210 (especially, first side portion (210b)) of electronic component (200a) and electrode 210 (especially, first side portion (210b)) of electronic component (200b) face each other, and are set to have substantially the same electric potential.

Electrode 210 (especially, first side portion (210b)) and electrode 220 (especially, second side portion (220b)) of electronic component (200d) (fourth electronic component) are arrayed on substantially a straight line (on straight line (L2) in FIG. 32, for example) with electrode 210 (especially, first side portion (210b)) and electrode 220 (especially, second side portion (220b)) of electronic component (200e) (fifth electronic component). In addition, electrode 210 (especially, first side portion (210b)) of electronic component (200d) and electrode 210 (especially, first side portion (210b)) of electronic component (200e) face each other, and are set to have substantially the same electric potential.

Figure 33:
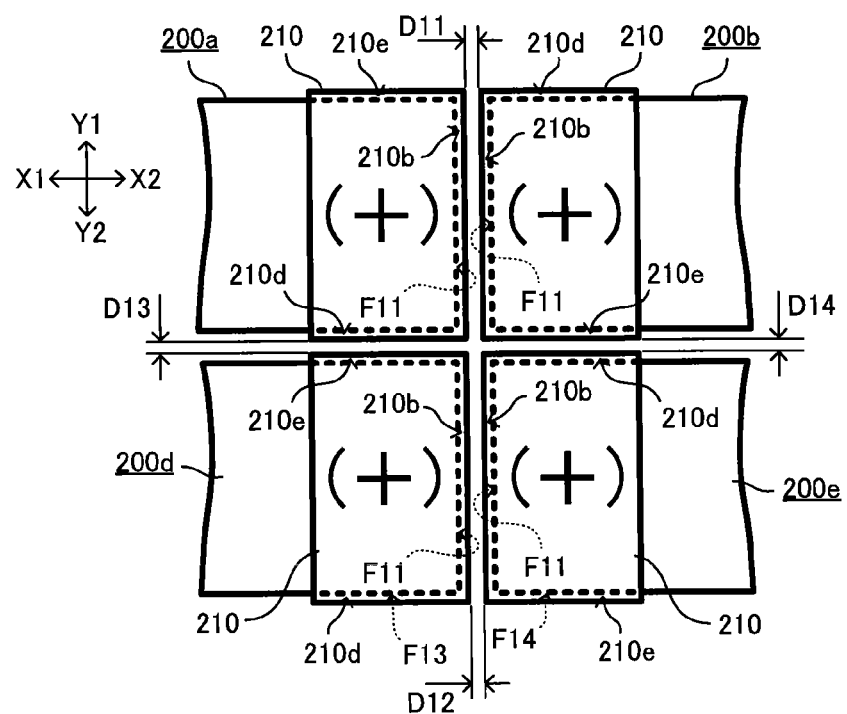
FIG. 33 is a plan view showing electrodes formed in their respective side surfaces of chip capacitors built into a wiring board in the example shown in FIG. 32.

As shown in FIG. 33, third side portion (210d) (third side electrode) and fourth side portion (210e) (fourth side electrode) of electrode 210 of electronic component (200a) (first electronic component) are arrayed on substantially the same straight line (on straight line (L3) in FIG. 32, for example) with third side portion (210d) (third side electrode) and fourth side portion (210e) (fourth side electrode) of electrode 210 of electronic component (200d) (fourth electronic component). In addition, third side portion (210d) of electrode 210 of electronic component (200a) and fourth side portion (210e) of electrode 210 of electronic component (200d) face each other, and are set to have substantially the same electric potential.

Also, third side portion (210d) (third side electrode) and fourth side portion (210e) (fourth side electrode) of electrode 210 of electronic component (200b) (second electronic component) are arrayed on substantially the same straight line (on straight line (L4) in FIG. 32, for example) with third side portion (210d) (third side electrode) and fourth side portion (210e) (fourth side electrode) of electrode 210 of electronic component (200e) (fifth electronic component). In addition, fourth side portion (210e) of electrode 210 of electronic component (200b) and third side portion (210d) of electrode 210 of electronic component (200e) face each other, and are set to have substantially the same electric potential.

Distance (D11) between adjacent electronic components (200a, 200b), namely, the minimum distance between opposing first side portions (210b) (first side electrodes), is preferred to be 150 μm or less. Also, distance (D12) between adjacent electronic components (200d, 200e), namely, the minimum distance between opposing first side portions (210b) (first side electrodes), is preferred to be 150 μm or less. If distances (D11, D12) are small, it is easier to make cavity (R10) smaller. As a result, positional shifting of electronic components is less likely to occur, or wiring regions are easier to increase. In the example shown in FIG. 32, since electrodes (210, 210, 210, 210) of the electronic components are set to have substantially the same electric potential as each other, electrical characteristics are less likely to be degraded even when electrodes (210, 210) of adjacent electronic components make contact. Accordingly, it is easier to decrease distances (D11, D12) (minimum distances).

Distance (D13) of adjacent electronic components (200a, 200d), namely, the minimum distance between third side portion (210d) (third side electrode) of electrode 210 of electronic component (200a) and its opposing fourth side portion (210e) (fourth side electrode) of electrode 210 of electronic component (200d), is preferred to be 150 μm or less. Also, (D14) of adjacent electronic components (200b, 200e), namely, the minimum distance between fourth side portion (210e) (fourth side electrode) of electrode 210 of electronic component (200b) and its opposing third side portion (210d) (third side electrode) of electrode 210 of electronic component (200e), is preferred to be 150 μm or less. If distances (D13, D14) are small, it is easier to make cavity (R10) smaller. As a result, positional shifting of electronic components is less likely to occur, or wiring regions are easier to increase. In the example shown in FIG. 32, since electrodes (210, 210, 210, 210) of the electronic components are set to have substantially the same electric potential as each other, electrical characteristics are less likely to be degraded even when electrodes (210, 210) of adjacent electronic components make contact. Accordingly, it is easier to decrease distances (D13, D14) (minimum distances).

Each of electronic components (200a, 200b, 200d, 200e) positioned in cavity (R10) is set to be adjacent to the other three electronic components, and their opposing side electrodes are set to have substantially the same electric potential as each other. Specifically, for example, electronic component (200a) is positioned to be adjacent to electronic components (200b, 200d, 200e), and electrode 210 of electronic component (200a) faces electrodes (210, 210, 210) of electronic components (200b, 200d, 200e). Namely, electrode 210 of electronic component (200a) faces electrodes (210, 210, 210) of the other electronic components (200b, 200d, 200e) in three directions. Then, such opposing electrodes (210, 210, 210, 210) are all set to have substantially the same electric potential as each other. Namely, the electric potential values at electrodes (210, 210, 210, 210) of the electronic components have the same polarity (positive polarity) as each other, and their absolute values are substantially equal to each other.

Figure 34A:
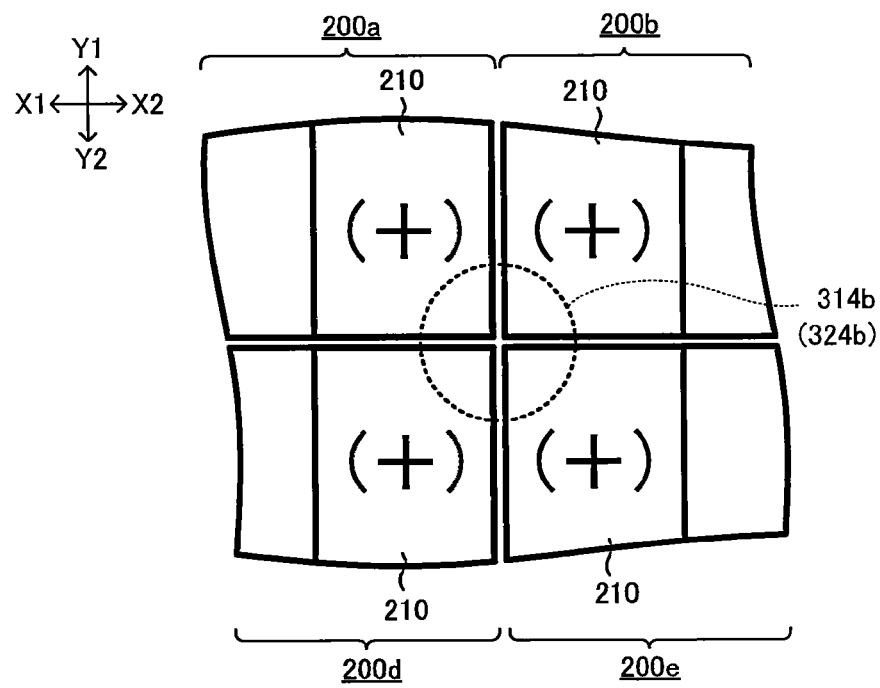
FIG. 34A is, in the wiring board shown in FIG. 32, a view showing a wiring board having a via conductor connected to all the opposing side electrodes of adjacent electronic components.
Figure 34B:
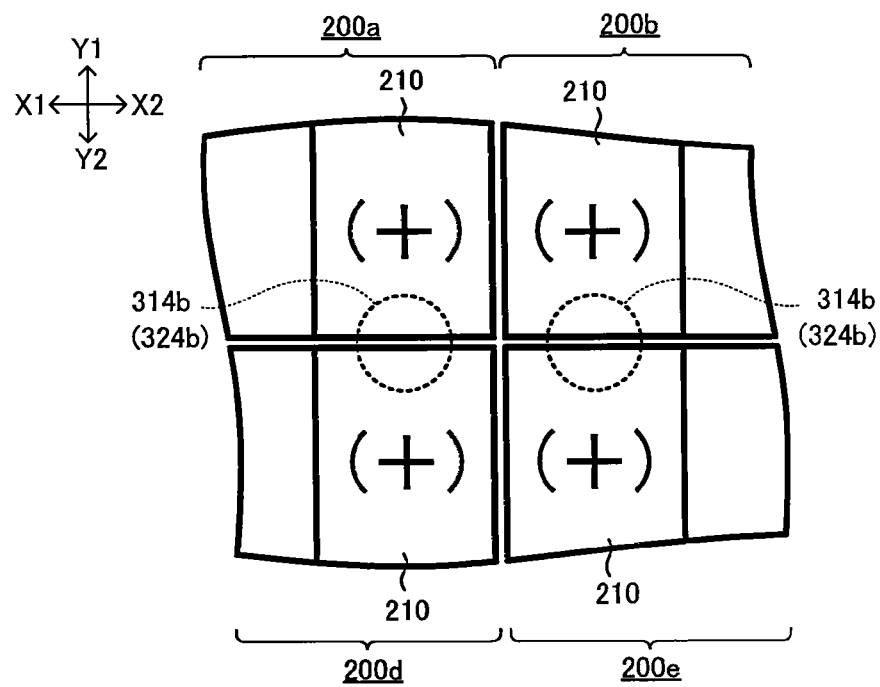
FIG. 34B is, in the wiring board shown in FIG. 32, a view showing a wiring board having two via conductors each connected to two of the opposing side electrodes of adjacent electronic components.

As shown in FIGS. 34A and 34B, via conductor (314b) or (324b) shown in FIG. 27A or 27B may be applied to the wiring board shown in FIG. 32.

In the example shown in FIG. 34A, via conductor (314b) or (324b) is connected to all electrodes (210, 210, 210, 210) of electronic components (200a, 200b, 200d, 200e).

The wiring board shown in FIG. 34B has via conductor (314b) or (324b), which is connected to electrode 210 of electronic component (200a) as well as to electrode 210 of electronic component (200d), and via conductor (314b) or (324b), which is connected to electrode 210 of electronic component (200b) as well as to electrode 210 of electronic component (200e).

Figure 35:
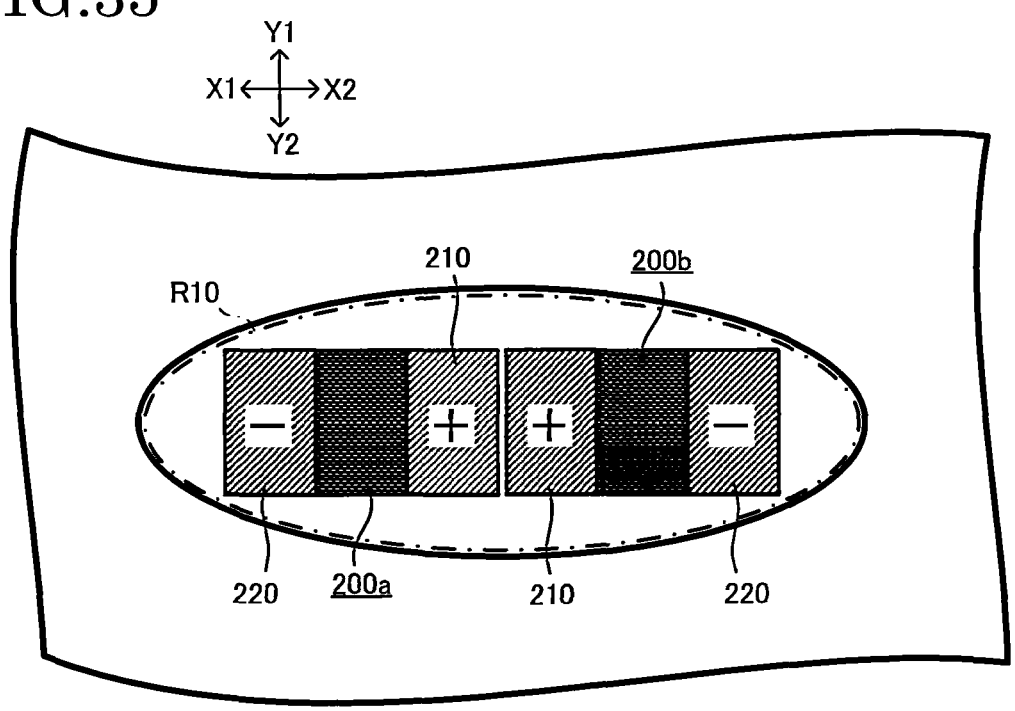
FIG. 35 is, in a wiring board according to yet another embodiment of the present invention, a view showing the shape of an opening section.

The shape of electronic components (200a, 200b) and the shape of cavity (R10) are not limited specifically. For example, the opening shape of cavity (R10) may be substantially elliptical as shown in FIG. 35. However, to make cavity (R10) smaller for the purpose of increasing wiring regions on substrate 100 or the like, it is preferred that the opening shape of cavity (R10) correspond to the outline of electronic components to be positioned in cavity (R10) (see FIG. 4 and others).

The planar shape of electronic components (200a, 200b) and the opening shape of cavity (R10) may be substantially circular (substantially a perfect circle), or they may be substantially polygonal except for being substantially rectangular: substantially square, substantially regular hexagonal, substantially regular octagonal, and the like. In addition, the shapes of angles of polygons are determined freely. For example, they may be substantially right angles, acute angles, obtuse angles, or even roundish.

Figure 36:
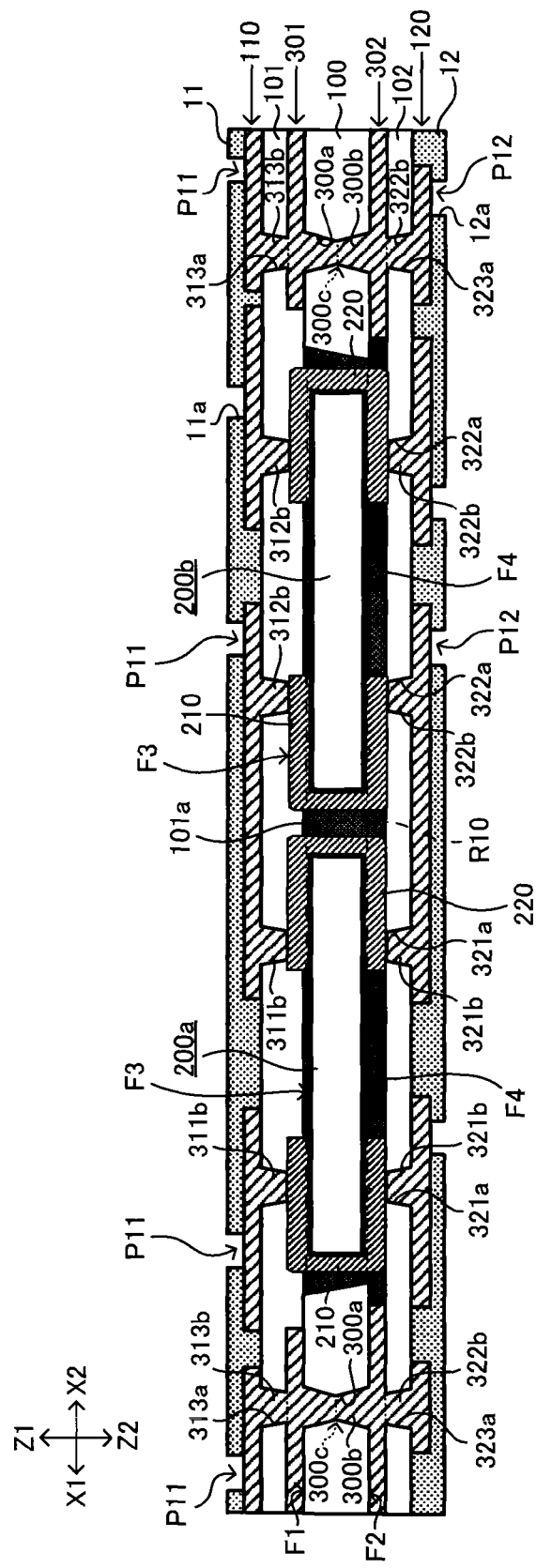
FIG. 36 is, in yet another embodiment of the present invention, a view showing a wiring board having a double-sided via structure.

In the above embodiment, the wiring board has a single-sided via structure for electronic components (200a, 200b). However, that is not the only option. For example, as shown in FIG. 36, it may be a wiring board which has via conductors (311b, 312b, 321b, 322b) positioned on both sides of electronic components (200a, 200b) to be electrically connected to electrodes (210, 220) of electronic components (200a, 200b).

Figure 37:
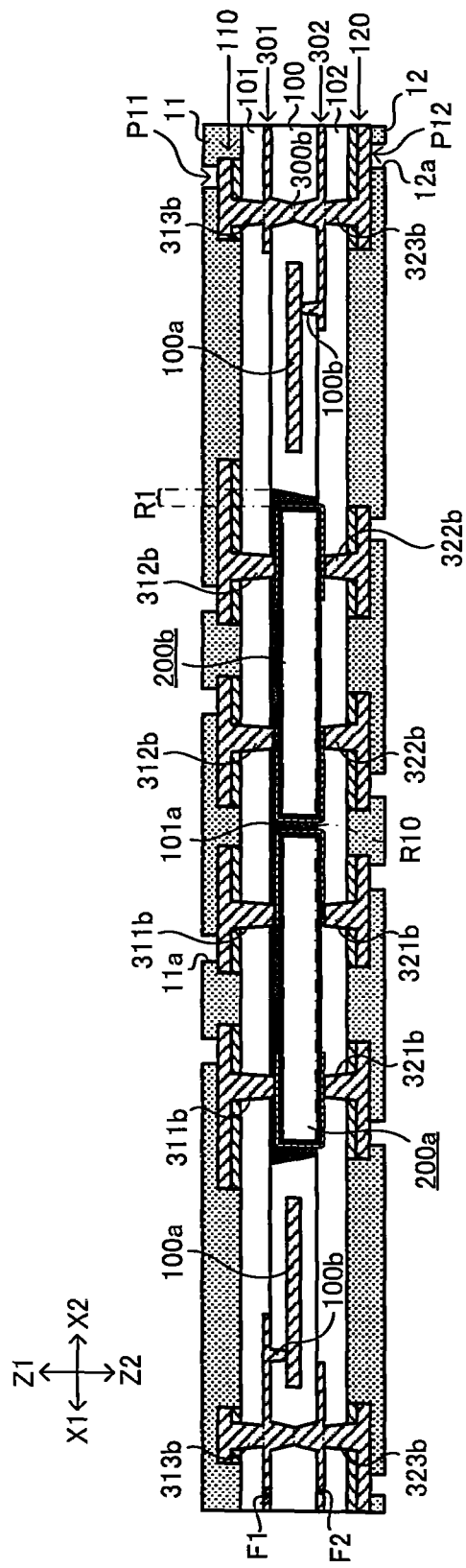
FIG. 37 is, in yet another embodiment of the present invention, a view showing a wiring board having a core substrate with a built-in metal sheet.

As shown in FIG. 37, substrate 100 (core substrate) may be an insulative substrate with built-in metal sheet (100a) (such as copper foil). In such substrate 100, heat radiation is improved by metal sheet (100a). In the example shown in FIG. 37, via conductor (100b) is formed in substrate 100 to reach metal sheet (100a), and metal sheet (100a) is electrically connected to a ground line (conductive patterns included in conductive layers (301, 302) by via conductor (100b). The planar shape of metal sheet (100a) is not limited specifically, and it may be rectangular or circular.

In the following, a method for manufacturing substrate 100 (core substrate) shown in FIG. 37 is described with reference to FIGS. 38A and 38B.

Figure 38A:
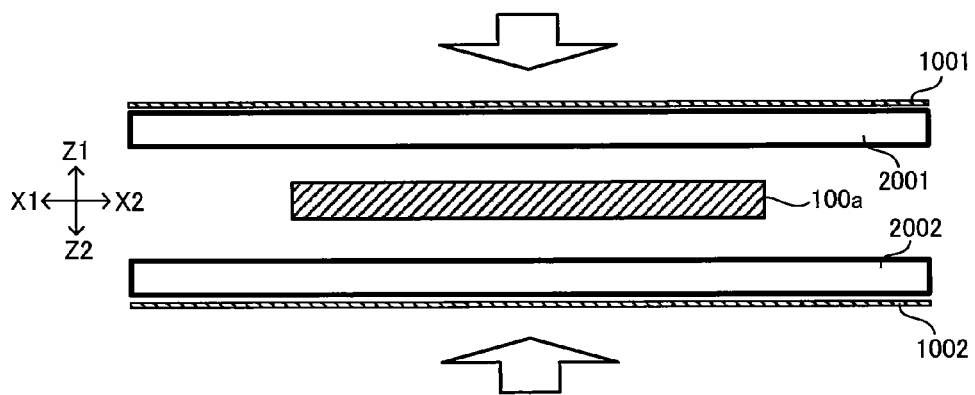
FIG. 38A is a view illustrating a first step for manufacturing a core substrate to be used in the wiring board shown in FIG. 37.
Figure 38B:
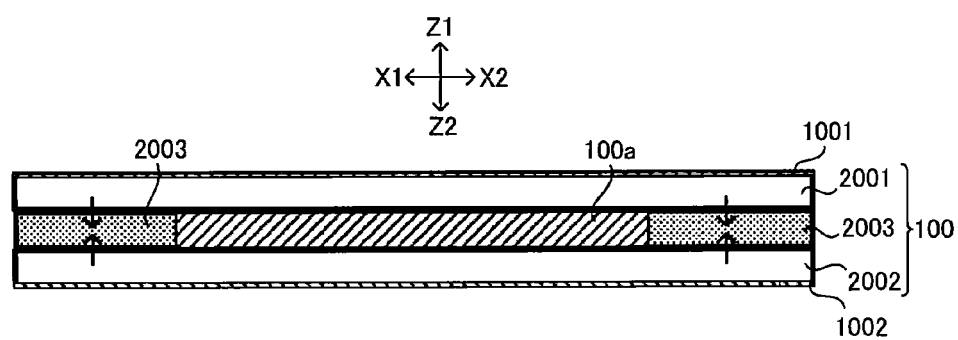
FIG. 38B is a view illustrating a second step subsequent to the step in FIG. 38A.

First, as shown in FIG. 38A, insulation layers (2001, 2002) are positioned to sandwich metal sheet (100a) made of copper foil, for example, and then copper foil 1001 is positioned on insulation layer 2001 and copper foil 1002 is positioned on insulation layer 2002. Insulation layers (2001, 2002) are each made of prepreg of glass epoxy, for example.

Pressure is added toward the direction of metal sheet (100a) by pressing. By pressing semicured insulation layers (2001, 2002), resin is flowed out from insulation layers (2001, 2002) as shown in FIG. 38B. In doing so, insulation layer 2003 is formed on sides of metal sheet (100a). Then, insulation layers (2001, 2002, 2003) are each cured by heating. Accordingly, substrate 100 (core substrate) with built-in metal sheet (100a) is completed.

The structure of wiring board 10 as well as the type, quality, dimensions, material, shape, number of layers, positioning or the like of the elements of the structure may be modified freely within a scope that does not deviate from the gist of the present invention.

The above embodiment shows a double-sided wiring board (wiring board 10) having a conductive layer on both sides of a core substrate. However, that is not the only option. For example, it may be a single-sided wiring board having a conductive layer only on one side of the core substrate (substrate 100).

Also, cavity (R10) (accommodation space for electronic components) may be a hole that does not penetrate through substrate 100 (recessed portion).

The wiring board may have two or more buildup layers on one side of the core substrate. In addition, the number of buildup layers may be different on the first-surface (F1) side of substrate 100 and on the second-surface (F2) side of substrate 100. However, to mitigate stress, it is preferred to enhance symmetry on the upper and lower sides by setting the number of buildup layers on the first-surface (F1) side of substrate 100 to be the same on the second-surface (F2) side of substrate 100.

The shape of the electrodes of chip capacitors positioned in cavity (R10) (opening section) is not limited to a U-shape. For example, it may be such that capacitor body 201 is sandwiched by a pair of flat-sheet-type electrodes.

The type of electronic components positioned in cavity (R10) (opening section) is not limited specifically. For example, passive components such as capacitors, resistors or coils as well as active components such as IC circuits may be selected freely. Also, two or more types of electronic components (capacitor and diode, for example) may be positioned in one cavity (R10) (opening section).

Each via conductor is not limited to being a filled conductor, and it may be a conformal conductor, for example.

Instead of using via connection (via conductors) for mounting electronic components to be positioned in cavity (R10) (opening section), other methods such as wire bonding may also be used.

The manufacturing method of wiring boards is not limited to the order and contents shown in FIG. 9. The order and contents may be modified within a scope that does not deviate from the gist of the present invention. Also, some steps may be omitted depending on usage requirements.

For example, a method for forming each conductive layer is selected freely. For example, any one method or two or more methods may be freely selected from the following to form conductive layers: panel plating, pattern plating, full-additive, semi-additive (SAP), subtractive, transfer and tenting methods.

In addition, instead of using a laser, wet or dry etching may be employed for processing. When processing by etching, it is preferable to protect in advance the portions not required to be removed by using resist or the like.

The above embodiment and its modified examples may be combined freely. Appropriate combinations may be selected according to usage purposes. For example, in the example shown in FIG. 32, electrodes 220 with negative polarity may be set as opposing electrodes, the same as in the example shown in FIG. 29A.

A wiring board according to an embodiment of the present invention has a substrate having an opening section, a first electronic component and a second electronic component positioned in the opening section, an insulation layer positioned on the substrate, on the first electronic component and on the second electronic component, and a conductive layer positioned on the insulation layer. In such a wiring board, the first electronic component and the second electronic component each have a first side electrode on a first side and a second side electrode on a second side opposite the first side, the first side electrode and the second side electrode of the first electronic component are arrayed substantially on a straight line with the first side electrode and the second side electrode of the second electronic component, and the first side electrode of the first electronic component and the first side electrode of the second electronic component face each other and are set to have substantially the same electric potential.

A method for manufacturing a wiring board according to an embodiment of the present invention includes the following: preparing a substrate; forming an opening section in the substrate; in the opening section, positioning a first electronic component and a second electronic component each having a first side electrode on a first side and a second side electrode on a second side opposite the first side in such a way that the first side electrode and the second side electrode of the first electronic component are arrayed on substantially a straight line with the first side electrode and the second side electrode of the second electronic component, and the first side electrodes face each other; forming an insulation layer on the substrate, on the first electronic component and on the second electronic component; forming a conductive layer on the insulation layer; and setting the opposing first side electrodes to have substantially the same electric potential as each other.

A wiring board according to an embodiment of the present invention is suitable for forming electrical circuits of a built-in electronic component. Also, a method for manufacturing a wiring board according to an embodiment of the present invention is suitable for manufacturing wiring boards.

Obviously, numerous modifications and variations of the present invention are possible in light of the above teachings. It is therefore to be understood that within the scope of the appended claims, the invention may be practiced otherwise than as specifically described herein.

What is claimed is:

1. A wiring board, comprising:
   a substrate having an opening portion;
   a plurality of electronic components positioned in the opening portion of the substrate and including a first electronic component and a second electronic component; and
   an insulation layer formed over the substrate and the first electronic component and second electronic component of the plurality of electronic components,
   wherein the first electronic component has a first electrode having a side portion formed on a first side surface of the first electronic component and a second electrode having a side portion formed on a second side surface of the first electronic component on an opposite side of the first side surface of the first electronic component, the second electronic component has a first electrode having a side portion formed on a first side surface of the second electronic component and a second electrode having a side portion formed on a second side surface of the second electronic component on an opposite side of the first side surface of the second electronic component, the first electrode of the first electronic component and the first electrode of the second electronic component are set to have substantially a same electric potential, and the first electronic component and the second electronic component are positioned in the opening portion of the substrate such that the side portion of the first electrode of the first electronic component is beside the side portion of the first electrode of the second electronic component.

2. The wiring board according to claim 1, wherein the first electronic component and the second electronic component are positioned in the opening portion of the substrate such that the first electrode and the second electrode of the first electronic component are arrayed substantially on a straight line with the first electrode and the second electrode of the second electronic component.

3. The wiring board according to claim 1, further comprising a wiring configured to electrically connect the side portion of the first electrode of the first electronic component and the side portion of the first electrode of the second electronic component to each other.

4. The wiring board according to claim 1, further comprising a conductive layer formed on the insulation layer.

5. The wiring board according to claim 1, wherein the first and second electronic components have a distance set at 150 μm or less between the side portions of the first electrodes of the first and second electronic components.

6. The wiring board according to claim 1, wherein the side portions of the first electrodes of the first and second electronic components are in contact with each other.

7. The wiring board according to claim 1, further comprising a second insulation layer comprising a core material and formed over the substrate and the first and second electronic components of the plurality of electronic components on an opposite side of the substrate with respect to the insulation layer, wherein the insulation layer includes a core material.

8. The wiring board according to claim 1, further comprising:
   a conductive layer formed on the insulation layer; and
   a via conductor comprising a conductor and formed in a hole formed through the insulation layer,
   wherein the conductive layer is connected to the first electrode of the first electronic component by the via conductor.

9. The wiring board according to claim 8, wherein the via conductor is connected to the first electrodes of the first and second electronic components.

10. The wiring board according to claim 1, wherein the first electronic component and the second electronic component are a same type of electronic components.

11. The wiring board according to claim 10, wherein the first electronic component and the second electronic component are chip capacitors, respectively.

12. The wiring board according to claim 11, wherein the first electrode of the first electronic component has an upper portion formed on an upper surface of the first electronic component and a lower portion formed on a lower surface of the first electronic component and connected to the upper portion of the first electrode through the side portion of the first electrode of the first electronic component, the second electrode of the first electronic component has an upper portion formed on the upper surface of the first electronic component and a lower portion formed on the lower surface of the first electronic component and connected to the upper portion of the second electrode through the side portion of the second electrode of the first electronic component, the first electrode of the second electronic component has an upper portion formed on an upper surface of the second electronic component and a lower portion formed on a lower surface of the second electronic component and connected to the upper portion of the first electrode through the side portion of the first electrode of the second electronic component, and the second electrode of the second electronic component has an upper portion formed on the upper surface of the second electronic component and a lower portion formed on the lower surface of the second electronic component and connected to the upper portion of the second electrode through the side portion of the second electrode of the second electronic component.

13. The wiring board according to claim 1, wherein the insulation layer comprises a resin filling a space between the substrate and the electronic components in the opening portion of the substrate and a space between the first electronic component and the second electronic component in the opening portion of the substrate.

14. The wiring board according to claim 1, further comprising an external connection terminal positioned directly over one of the first electronic component and the second electronic component.

15. The wiring board according to claim 1, wherein the substrate is an insulative substrate having a built-in metal sheet.

16. The wiring board according to claim 1, further comprising:

a conductive layer formed on the insulation layer; and a plurality of via conductors each comprising a conductor and formed in a plurality of holes formed through the insulation layer, respectively, wherein the via conductors are connected to the first and second electrodes of the first electronic component and the first and second electrodes of the second electronic component, respectively, such that the conductive layer is connected to the first and second electrodes of the first electronic component and the first and second electrodes of the second electronic component by the via conductors, respectively.

17. The wiring board according to claim 1, further comprising:

an insulator portion filling the opening portion of the substrate such that the insulator portion is filling a space between the electronic components positioned in the opening portion of the substrate.

18. The wiring board according to claim 1, further comprising:

an insulator portion filling the opening portion of the substrate such that the insulator portion is filling a space between the electronic components positioned in the opening portion of the substrate, wherein the insulator portion comprises an insulative material derived from the insulation layer.

19. The wiring board according to claim 18, further comprising:

a conductive layer formed on the insulation layer; and a plurality of via conductors each comprising a conductor and formed in a plurality of holes formed through the insulation layer, respectively, wherein the via conductors are connected to the first and second electrodes of the first electronic component and the first and second electrodes of the second electronic component, respectively, such that the conductive layer is connected to the first and second electrodes of the first electronic component and the first and second electrodes of the second electronic component by the via conductors, respectively.

20. A method for manufacturing a wiring board, comprising:

preparing a substrate having an opening portion;

disposing in the opening portion of the substrate a plurality of electronic components including a first electronic component and a second electronic component; and forming an insulation layer over the substrate and the first electronic component and second electronic component of the plurality of electronic components, wherein the first electronic component has a first electrode having a side portion formed on a first side surface of the first electronic component and a second electrode having a side portion formed on a second side surface of the first electronic component on an opposite side of the first side surface of the first electronic component, the second electronic component has a first electrode having a side portion formed on a first side surface of the second electronic component and a second electrode having a side portion formed on a second side surface of the second electronic component on an opposite side of the first side surface of the second electronic component, the disposing of the electronic components comprises positioning the first electronic component and the second electronic component in the opening portion of the substrate such that the side portion of the first electrode of the first electronic component is beside the side portion of the first electrode of the second electronic component, and setting the first electrode of the first electronic component and the first electrode of the second electronic component to have substantially a same electric potential.

* * * * *